(12) United States Patent
Jang

(10) Patent No.: US 9,472,617 B2
(45) Date of Patent: Oct. 18, 2016

(54) SEMICONDUCTOR DEVICE

(71) Applicant: Samsung Electronics Co., Ltd., Suwon-Si, Gyeonggi-Do (KR)

(72) Inventor: Hyeon-Woo Jang, Suwon-si (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 0 days.

(21) Appl. No.: 14/604,339

(22) Filed: Jan. 23, 2015

(65) Prior Publication Data
US 2016/0043171 A1 Feb. 11, 2016

(30) Foreign Application Priority Data

Aug. 11, 2014 (KR) .................. 10-2014-0103759

(51) Int. Cl.
| | |
|---|---|
| *H01L 29/78* | (2006.01) |
| *H01L 29/06* | (2006.01) |
| *H01L 23/528* | (2006.01) |
| *H01L 29/08* | (2006.01) |
| *H01L 29/423* | (2006.01) |
| *H01L 27/108* | (2006.01) |
| *H01L 27/12* | (2006.01) |

(52) U.S. Cl.
CPC ......... *H01L 29/0653* (2013.01); *H01L 23/528* (2013.01); *H01L 29/0847* (2013.01); *H01L 29/4236* (2013.01); *H01L 29/78* (2013.01); *H01L 27/10814* (2013.01); *H01L 27/10823* (2013.01); *H01L 27/10852* (2013.01); *H01L 27/1203* (2013.01)

(58) Field of Classification Search
CPC . H01L 29/0653; H01L 29/78; H01L 23/528; H01L 29/0847; H01L 29/4236; H01L 27/10814; H01L 27/10823; H01L 27/10852; H01L 27/10876; H01L 27/1203
USPC .................. 257/296, 330, 368, 347, E27.06, 257/E29.255, E21.409; 438/151, 257, 270
See application file for complete search history.

(56) References Cited

U.S. PATENT DOCUMENTS 6,537,870 B1 * 3/2003 Shen ................. H01L 27/10864
257/E21.652

(Continued)

FOREIGN PATENT DOCUMENTS

| | | |
|---|---|---|
| JP | 2012109353 A | 6/2012 |
| KR | 1020110115969 A | 10/2011 |
| KR | 101149043 B1 | 5/2012 |

*Primary Examiner* — Thinh T Nguyen
(74) *Attorney, Agent, or Firm* — Harness, Dickey & Pierce, P.L.C.

(57) ABSTRACT

Provided is a semiconductor device. The semiconductor device includes an isolation region disposed in a semiconductor substrate and configured to define an active region. A gate electrode buried in the active region is disposed. A gate dielectric layer is disposed between the active region and the gate electrode. A first source/drain region and a second source/drain region are disposed in the active region on both sides of the gate electrodes. An interconnection structure intersecting with the gate electrode, overlapping the first and second source/drain regions, electrically connected with the first source/drain region, and spaced apart from the second source/drain region is disposed. A contact structure is disposed on the second source/drain region.

20 Claims, 45 Drawing Sheets

(56) References Cited

U.S. PATENT DOCUMENTS

| | | | |
|---|---|---|---|
| 7,772,631 B2 * | 8/2010 | Schloesser | H01L 27/10891 257/296 |
| 7,799,643 B2 * | 9/2010 | Kang | H01L 21/76897 438/272 |
| 8,169,020 B2 | 5/2012 | Cho | |
| 8,488,374 B2 | 7/2013 | Liu | |
| 8,507,966 B2 | 8/2013 | Tang et al. | |
| 2007/0023784 A1 * | 2/2007 | Schloesser | H01L 27/10891 257/208 |
| 2008/0283957 A1 * | 11/2008 | Kang | H01L 21/76897 257/499 |
| 2011/0254085 A1 | 10/2011 | Lee | |
| 2011/0284939 A1 * | 11/2011 | Chung | H01L 27/10805 257/296 |
| 2012/0119278 A1 | 5/2012 | Mikasa | |
| 2013/0323887 A1 | 12/2013 | Tang | |
| 2013/0341695 A1 | 12/2013 | Fazan | |
| 2014/0138768 A1 | 5/2014 | Lee | |

* cited by examiner

SEMICONDUCTOR DEVICE

CROSS-REFERENCE TO RELATED APPLICATION

This application claims priority under 35 U.S.C. §119 to Korean Patent Application No. 10-2014-0103759 filed on Aug. 11, 2014, the disclosure of which is hereby incorporated by reference in its entirety.

BACKGROUND

1. Technical Field

Example embodiments of the inventive concepts relate to a semiconductor device, a method of forming a semiconductor device, and an electronic system using the same.

2. Description of Related Art

To achieve a high integration of a semiconductor device, components included in the semiconductor device are gradually becoming smaller. By using a conventional layout, it is difficult to reduce the size of each of the components included in the semiconductor device and reliably form the components. For example, there is a limitation to achieving the high integration of the semiconductor device by using a conventional 6F2 cell architecture in a memory device such as a DRAM.

SUMMARY

In accordance with at least one example embodiment of the inventive concepts, a semiconductor device includes an isolation region disposed in a semiconductor substrate and configured to define an active region. A gate electrode buried in the active region is disposed. A gate dielectric layer is disposed between the active region and the gate electrode. A first source/drain region and a second source/drain region are disposed in the active region on both sides of the gate electrodes. An interconnection structure intersecting the gate electrode, overlapping the first and second source/drain regions, electrically connecting to the first source/drain region, and spaced apart from the second source/drain region is disposed. A contact structure is disposed on the second source/drain region.

In at least one example embodiment, the first source/drain region may have a first width in a first direction and a second width smaller than the first width in a second direction perpendicular to the first direction, wherein the first direction may be a length direction of the gate electrode, and the second direction may be a length direction of the interconnection structure.

In at least one example embodiment, the isolation region may include first and second isolation lines parallel to each other, and third and fourth isolation lines parallel to each other and vertically crossing the first and second isolation lines.

In at least one example embodiment, the interconnection structure may be disposed between the first and second isolation lines and closer to the second isolation line than the first isolation line.

In at least one example embodiment, the second source/drain region may have a first upper surface and a second upper surface at a higher level than the first upper surface.

In at least one example embodiment, the first upper surface of the second source/drain region may overlap the interconnection structure and be spaced apart from the interconnection structure, and the second upper surface of the second source/drain region may overlap the contact structure and be electrically connected to the contact structure.

In at least one example embodiment, the interconnection structure may include a contact conductive pattern electrically connected to the first source/drain region, wherein a bottom surface of the contact conductive pattern of the interconnection structure is disposed at a lower level than the contact structure.

In at least one example embodiment, an insulating spacer structure on side surfaces of the interconnection structure may be further included.

In at least one example embodiment, the second source/drain region may overlap the contact structure, the insulating spacer structure, and the interconnection structure.

In at least one example embodiment, the insulating spacer structure may include an air spacer.

In accordance with at least one example embodiment of the inventive concepts, a semiconductor device may include an active region having first and second side surfaces facing each other, and third and fourth side surfaces facing each other. A first source/drain region and a second source/drain region spaced apart from each other may be disposed in the active region. A gate electrode buried in the active region between the first and second source/drain regions may be disposed. A gate dielectric layer may be disposed between the active region and the gate electrode. An interconnection structure disposed between the first and second side surfaces of the active region, closer to the second side surface than the first side surface, and electrically connected to the first source/drain region may be disposed. A contact structure electrically connected to the second source/drain region may be disposed.

In at least one example embodiment, the second source/drain region may overlap the contact structure and the interconnection structure.

In at least one example embodiment, the interconnection structure may vertically cross the gate electrode and pass over the third and fourth side surfaces of the active region.

In at least one example embodiment, lengths of the first and second side surfaces of the active region may be different from lengths of the third and fourth side surfaces.

In at least one example embodiment, the first and second source/drain regions may be long in a length direction of the gate electrode.

In accordance with at least one example embodiment of the inventive concepts, a semiconductor device includes an isolation region disposed in a semiconductor substrate and configured to define an active region. The isolation region has first and second isolation lines facing each other, and third and fourth isolation lines facing each other. A gate trench crossing the active region and the first and second isolation lines is disposed. A gate electrode and a gate capping pattern sequentially stacked are disposed in the gate trench. A gate dielectric layer is disposed between the gate electrode and the active region. A first source/drain region and a second source/drain region are disposed in the active region on both sides of the gate electrodes. An interconnection structure is disposed between the first and second isolation lines, closer to the second isolation line than the first isolation line, and electrically connected to the first source/drain region. A contact structure overlapping the second source/drain region, electrically connected to the second source/drain region, and spaced apart from the interconnection structure is disposed.

In at least one example embodiment, an upper surface of the contact structure may be disposed at a higher level than the interconnection structure.

In at least one example embodiment, the second source/drain region may have a first upper surface and a second upper surface at a lower level than the first upper surface. The first upper surface of the second source/drain region may include a portion overlapping the interconnection structure, and the second upper surface of the second source/drain region may include a portion overlapping the contact structure.

In at least one example embodiment, the contact structure may overlap the second source/drain region and overlap the isolation region adjacent to the second source/drain region.

In at least one example embodiment, an insulating isolation pattern overlapping the active region and adjacent to the interconnection structure and the contact structure may be further included.

Detailed items of the other example embodiments of the inventive concepts are included in the detailed descriptions and the accompanying drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. In the drawings.

DETAILED DESCRIPTION OF EXAMPLE EMBODIMENTS

Figure 1:
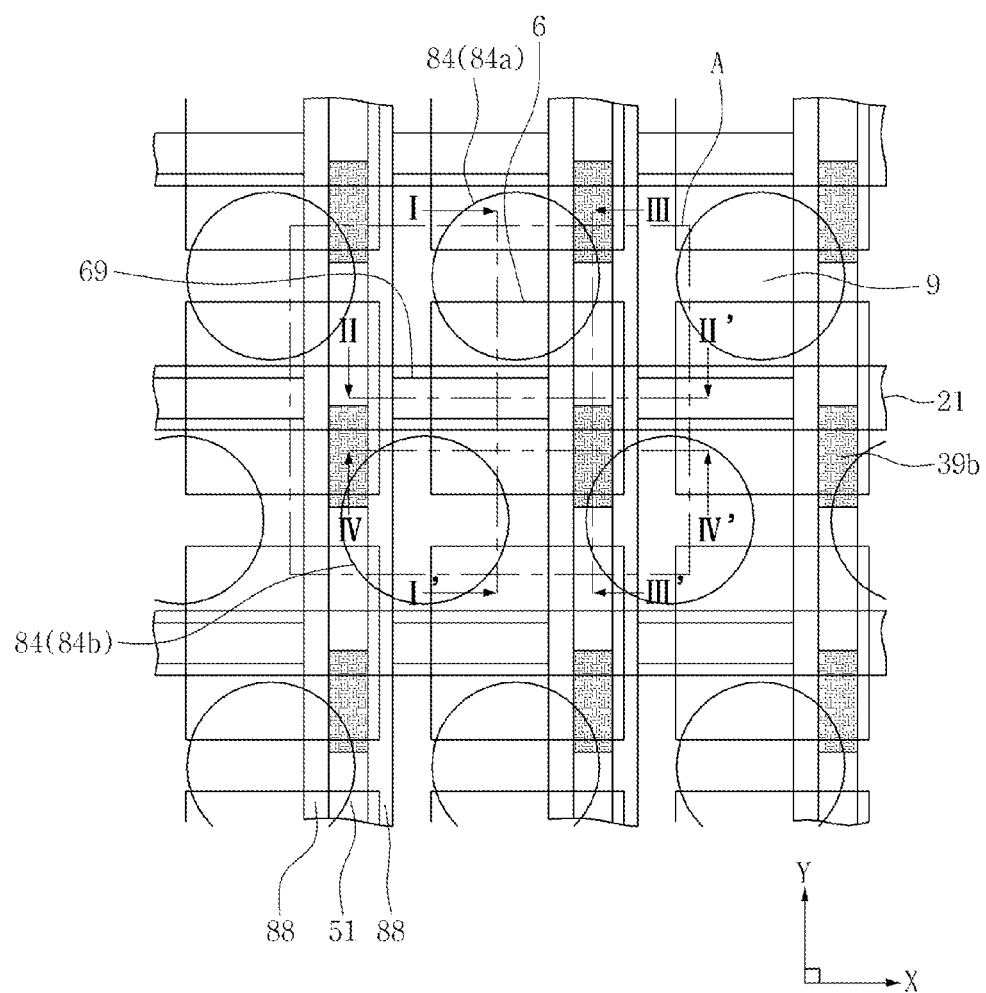
FIG. 1 is a plan view illustrating a semiconductor device in accordance with at least one example embodiment of the inventive concepts.

The inventive concepts may, however, be embodied in various different forms, and should be construed as limited, not by the example embodiments set forth herein, but only by the accompanying claims. Rather, these embodiments are provided so that this disclosure is thorough and complete and fully conveys the inventive concepts to those skilled in the art. In the drawings, the sizes and relative sizes of layers and regions may be exaggerated for clarity. The same reference symbols denote the same components throughout the specification.

Embodiments are described herein with reference to cross-sectional views, views, and/or block diagrams that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Therefore, regions illustrated in the drawings are schematic in nature, and their shapes are not intended to limit the inventive concepts but only to illustrate characteristic forms of regions of devices.

The thicknesses of layers and regions in the drawings may be exaggerated for the sake of clarity. Further, it will be understood that when a layer is referred to as being "on" another layer or a substrate, the layer may be formed directly on the other layer or the substrate, or there may be an intervening layer therebetween. The same reference numerals indicate the same components throughout the specification.

Terms such as "top," "bottom," "upper," "lower," "above," "below," and the like are used herein to describe the relative positions of elements or features. It will be understood that such descriptions are intended to encompass different orientations in use or operation in addition to orientations depicted in the drawings. For example, when an upper part of a drawing is referred to as a "top" and a lower part of a drawing as a "bottom" for the sake of convenience, in practice, the "top" may also be called a "bottom" and the "bottom" a "top" without departing from the teachings of the inventive concepts.

Furthermore, throughout this disclosure, directional terms such as "upper," "intermediate," "lower," and the like may be used herein to describe the relationship of one element or feature with another, and the inventive concepts should not be limited by these terms. Accordingly, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms are only used to distinguish one element from another. Thus, a first element could be termed a second element without departing from the teachings of the present inventive concepts.

The terminology used herein to describe embodiments of the invention is not intended to limit the scope of the invention.

Figure 2:
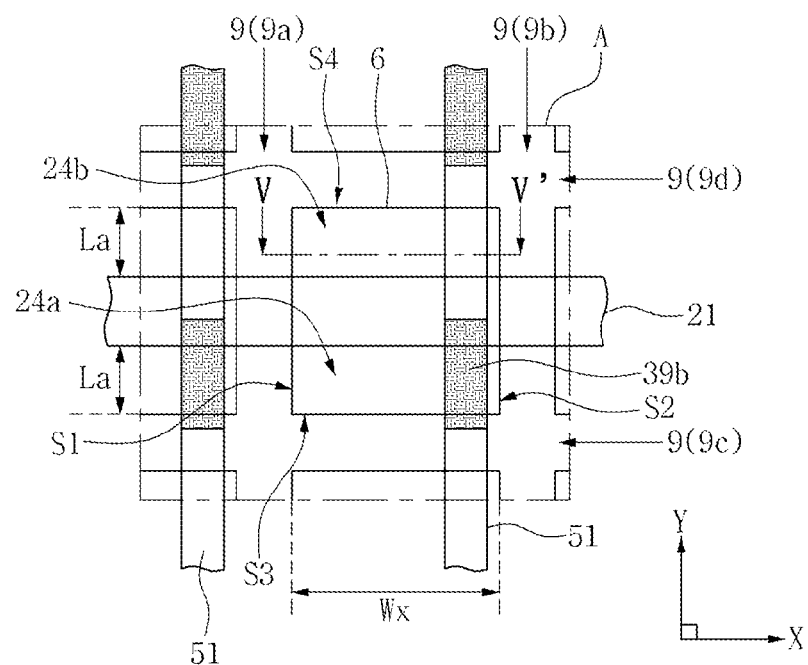
FIG. 2 is an enlarged view partially illustrating some components of FIG. 1.
Figure 3:
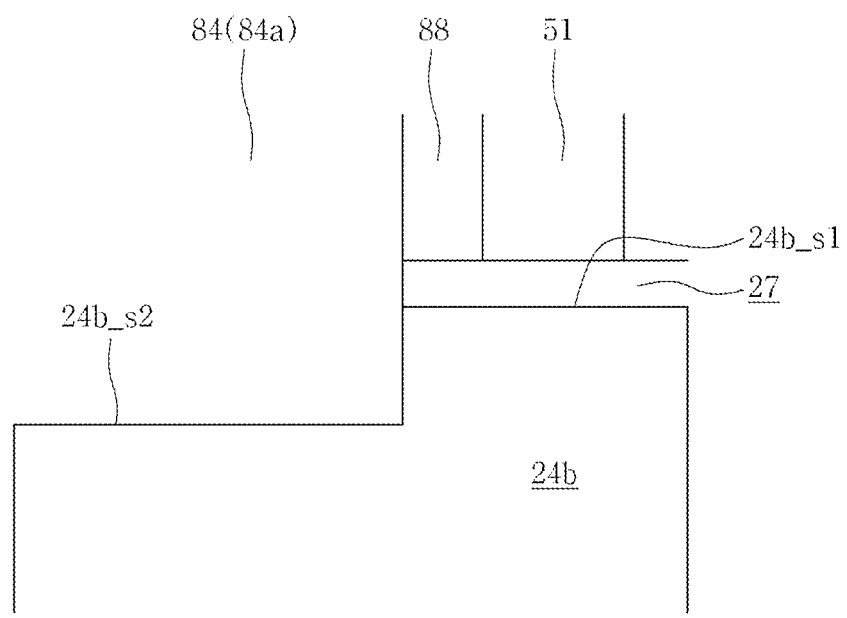
FIG. 3 is a cross-sectional view illustrating a part of a region taken along line V-V' of FIG. 2.
Figure 4A:
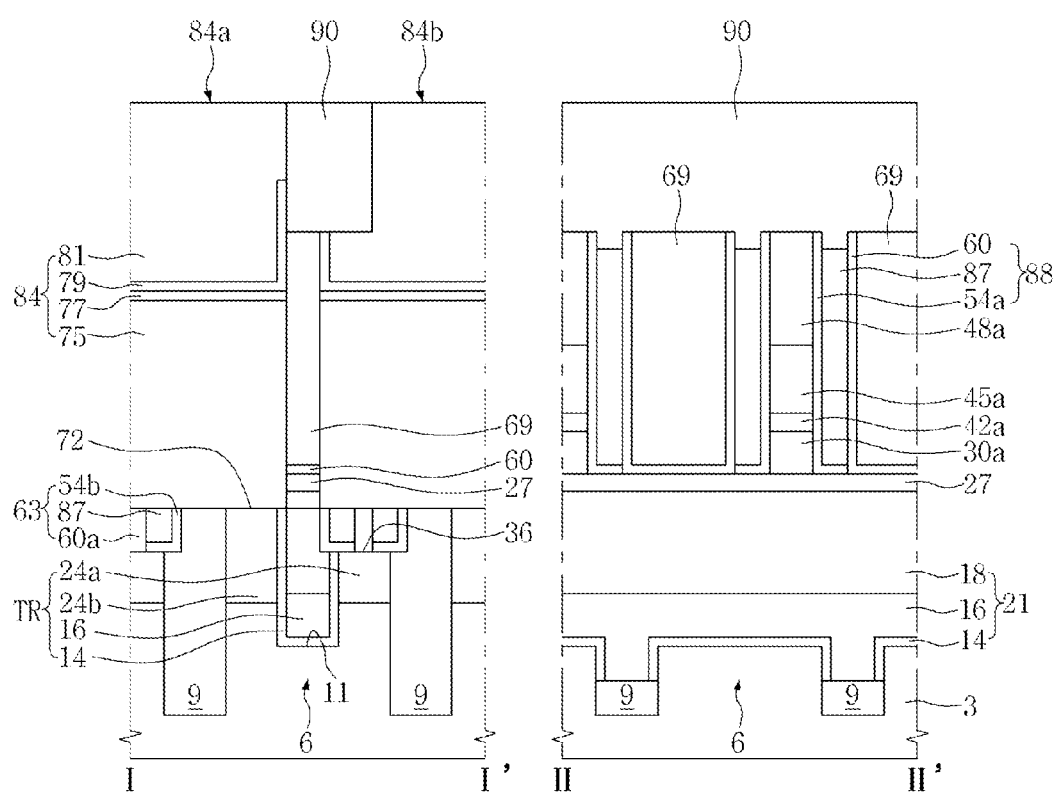
FIGS. 4A and 4B are cross-sectional views illustrating a semiconductor device in accordance with at least one example embodiment of the inventive concepts.
Figure 4B:
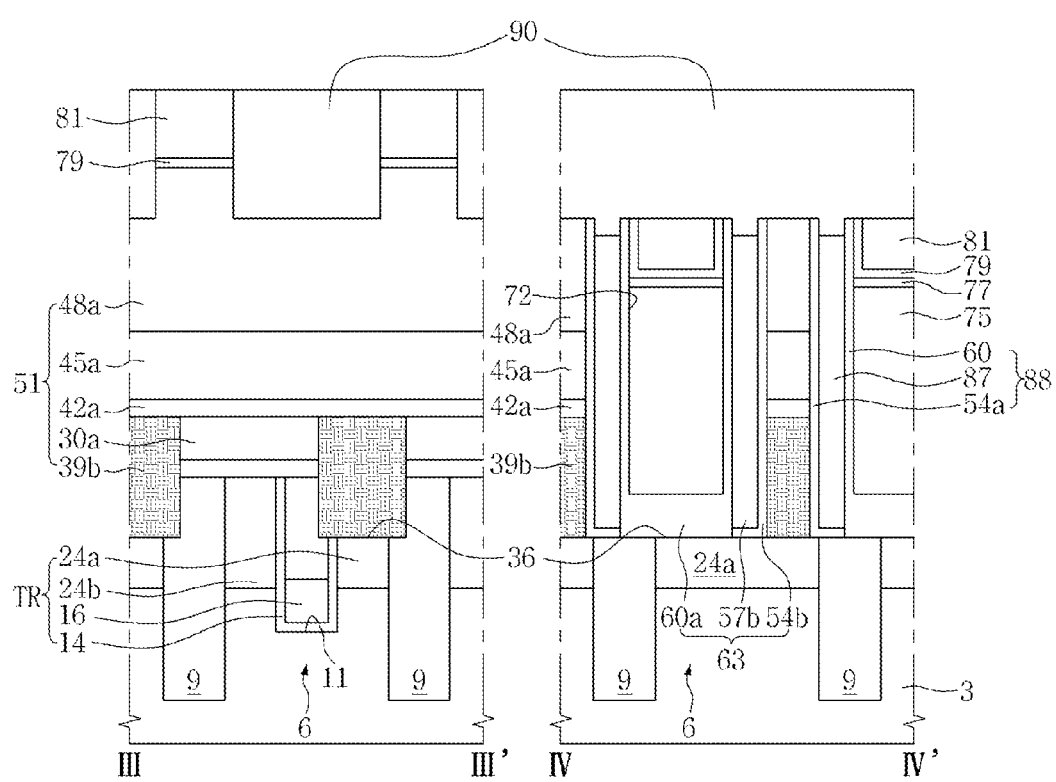

FIG. 1 is a plan view illustrating a semiconductor device in accordance with embodiments of the inventive concepts. FIG. 2 is an enlarged view partially illustrating a part "A" of FIG. 1 and illustrating some of components. FIG. 3 is an enlarged cross-sectional view partially illustrating some of components in a region taken along line V-V' of FIG. 2. FIGS. 4A and 4B are cross-sectional views illustrating the semiconductor device in accordance with at least one example embodiment of the inventive concepts. FIG. 4A is a cross-sectional view illustrating a region taken along line I-I' of FIG. 1 and a region taken along line II-II' of FIG. 1. FIG. 4B is a cross-sectional view illustrating a region taken along line III-III' of FIG. 1 and a region taken along line IV-IV' of FIG. 1.

Referring to FIGS. 1, 2, 3, 4A, and 4B, an isolation region 9 defining an active region 6 in a semiconductor substrate 3 may be disposed. The isolation region 9 may be a shallow trench device isolation layer. The isolation region 9 may include first and second isolation lines 9a and 9b in parallel and third and fourth isolation lines 9c and 9d in parallel. The first and second isolation lines 9a and 9b may vertically cross the third and fourth isolation lines 9c and 9d.

The active region 6 may have a first side surface S1 and a second side surface S2 facing each other, and a third side surface S3 and a fourth side surface S4 facing each other. For example, the active region 6 may be in a rectangular shape. The first side surface S1 of the active region 6 may face the first isolation line 9a, the second side surface S2 of the active region 6 may face the second isolation line 9b, the third side surface S3 of the active region 6 may face the third isolation line 9c, and the fourth side surface S4 of the active region 6 may face the fourth isolation line 9d.

Gate trenches 11 crossing the active region 6 and extend to the isolation region 9 may be disposed. Gate electrodes 16 and an insulating gate capping pattern 18 sequentially stacked in the gate trenches 11 may be disposed. The gate dielectric layer 14 may be interposed between both of the gate electrodes 16 and the gate capping pattern 18 and the active region 6. The gate dielectric layer 14, the gate electrodes 16, and the gate capping pattern 18 may form a gate structure 21. The gate electrodes 16 may be buried in the active region 6 and the isolation region 9. The gate electrodes 16 may be disposed at a lower level than an upper surface of the active region 6. The gate electrodes 16 may be in a line shape extending in a first direction (i.e., an X direction). The gate electrodes 16 may be a word line of a memory device.

The gate structure 21 parallel with the third and fourth isolation lines 9c and 9d may vertically cross the first and second isolation lines 9a and 9b. The gate structure 21 may be disposed between the third and fourth isolation lines 9c and 9d.

A first source/drain region 24a and a second source/drain region 24b spaced apart from each other may be disposed in the active region 6 on both sides of the gate structure 21. The gate structure 21 may cross the active region 6 between the first and second source/drain regions 24a and 24b and extend into the isolation region 9.

The first and second source/drain regions 24a and 24b, the gate dielectric layer 14, and the gate electrodes 16 may form a transistor (TR).

Each of the first and second source/drain regions 24a and 24b may be long in the first direction (i.e., the X direction) and be in a length direction of the gate electrodes 16 in the first direction (i.e., the X direction). Each of the first and second source/drain regions 24a and 24b may have a first width Wx in the first direction (i.e., the X direction), and have a second width La smaller than the first width Wx in a second direction (i.e., a Y direction) perpendicular to the first direction (i.e., the X direction).

An upper surface of the first source/drain region 24a may be disposed at a lower level than an upper surface of the second source/drain region 24b. The second source/drain region 24b may have upper surfaces 24b_s1 and 24b_s2 at different levels. The second source/drain region 24b may have a first upper surface 24b_s1 and a second upper surface 24b_s2 at a lower level than the first upper surface 24b_s1.

A buffer insulation layer 27 covering the gate structure 21, the first and second source/drain regions 24a and 24b, and the isolation region 9 may be disposed. A groove 36 passing over the first source/drain region 24a may be disposed.

In at least one example embodiment, the groove 36 may pass over the first source/drain region 24a in the first direction (the X direction) and extend to the isolation region 9. The first source/drain region 24a may be disposed under a lower portion of the groove 36. The groove 36 may recess an upper surface of the active region 6 and lower the upper surface of the first source/drain region 24a. Therefore, the first source/drain region 24a may have an upper surface at a lower level than the second source/drain region 24b.

An interconnection structure 51 intersecting the gate electrodes 16 may be disposed. The interconnection structure 51 may extend in the second direction (the Y direction) perpendicular to the first direction (the X direction). The interconnection structure 51 may be a bit line of the memory device.

The interconnection structure 51 may be disposed between the first and second isolation lines 9a and 9b adjacent and parallel to each other and disposed closer to the second isolation line 9b than the first isolation line 9a. The interconnection structure 51 may be disposed between the first and second side surfaces S1 and S2 of the active region 6 and closer to the second side surface S2 than the first side surface S1. The interconnection structure 51 may intersect the gate electrodes 16, pass between the first and second side surfaces S1 and S2 of the active region 6, and cross over the third and fourth side surfaces S3 and S4 of the active region 6.

The interconnection structure 51 may overlap the first and second source/drain regions 24a and 24b, may be electrically connected to the first source/drain region 24a, and may be spaced apart from the second source/drain region 24b. The interconnection structure 51 may overlap the first upper surface 24b_s1 of the second source/drain region 24b and may be spaced apart from the second source/drain region 24b. The buffer insulation layer 27 may be interposed between the interconnection structure 51 and the first upper surface 24b_s1 of the second source/drain region 24b.

The interconnection structure 51 may include a lower conductive pattern 30a, a contact conductive pattern 39b, a middle conductive pattern 42a, an upper conductive pattern 45a, and an insulating capping pattern 48a. The contact conductive pattern 39b may overlap the first source/drain region 24a and may be electrically connected to the first source/drain region 24a. The contact conductive pattern 39b may pass through the buffer insulation layer 27 and contact the first source/drain region 24a. The contact conductive pattern 39b may comprise polysilicon. The lower conductive pattern 30a may overlap the second source/drain region 24b and may be spaced apart from the second source/drain region 24b. The lower conductive pattern 30a may be disposed on the buffer insulation layer 27. The lower conductive pattern 30a may comprise polysilicon.

The middle conductive pattern 42a and the upper conductive pattern 45a may be stacked sequentially and may cover the contact conductive pattern 39b and the lower conductive pattern 30a. The middle conductive pattern 42a may include a metal nitride and/or a metal silicide. The upper conductive pattern 45a may be formed of a metal such as tungsten. The insulating capping pattern 48*a* may be disposed on the upper conductive pattern 45*a*. The insulating capping pattern 48*a* may be formed of silicon nitride.

An insulating spacer structure 88 may be disposed on a side surface of the interconnection structure 51. The insulating spacer structure 88 may include an inner spacer 54*a*, a middle spacer 87, and an outer spacer 60 sequentially arranged from a side surface of the interconnection structure 51. The middle spacer 87 may be an air spacer. The inner and the outer spacers 54*a* and 60 may be formed of silicon nitride. The outer spacer 60 may extend onto the buffer insulation layer 27 between the interconnection structures 51.

The groove 36 may be filled with the contact conductive pattern 39*b* of the interconnection structure 51 and an insulating structure 63. In at least one example embodiment, the insulating structure 63 may include layers 54*b*, 87, and 60*a* which are the same as the layers 54*a*, 87, and 60 included in the insulating spacer structure 88. For example, first and second gap-fill patterns 54*b* and 60*a* and an air spacer 87 between the first and second gap-fill patterns 54*b* and 60*a* may be included in the groove 36. The first gap-fill pattern 54*b* may have the same material as the inner spacer 54*a* of the insulating spacer structure 88, and the second gap-fill pattern 60*a* may have the same material as the outer spacer 60 of the insulating spacer structure 88.

A plurality of contact structures 84 spaced apart from each other may be disposed on the active region 6. The contact structures 84 may include first and second contact structures 84*a* and 84*b*. The first contact structure 84*a* may overlap the second source/drain region 24*b* and may be electrically connected to the second source/drain region 24*b*. The first contact structure 84*a* may overlap the second source/drain region 24*b* and an isolation region 9 adjacent to the second source/drain region 24*b*.

The first contact structure 84*a* may overlap the second upper surface 24*b*_s2 of the second source/drain region 24*b* and may be electrically connected to the second source/drain region 24*b*. A bottom surface of the first contact structure 84*a* may be disposed at a higher level than a bottom surface of the contact conductive pattern 39*b* of the interconnection structure 51. The second contact structure 84*b* may overlap the first source/drain region 24*a* of the active region 6, may be spaced apart from the first source/drain region 24*a*, and may be electrically connected to a second source/drain region 24*b* of another active region 6 adjacent to the active region 6. The insulating structure 63 may be interposed between the second contact structure 84*b* and the first source/drain region 24*a*.

Each of the contact structures 84 may include a lower contact pattern 75, a metal silicide layer 77, a barrier pattern 79, and an upper contact pattern 81.

The lower contact pattern 75 may contact the second source/drain region 24*b* and may be electrically connected to the second source/drain region 24*b*. The metal silicide layer 77 may be formed on the lower contact pattern 75 and formed of, for example, cobalt silicide, titanium silicide, or tungsten silicide. The upper contact pattern 81 may be formed on the metal silicide layer 77 and formed of, for example, a metal material such as tungsten. The barrier pattern 79 may be disposed between the upper contact pattern 81 and the metal silicide layer 77 and may extend to a side surface of the upper contact pattern 81.

An upper surface of the contact structure 84 may be disposed at a higher level than the interconnection structure 51. The upper contact pattern 81 of the contact structure 84 may have a portion located at a higher level than the interconnection structure 51.

An upper capping pattern 90 surrounds a side surface of the upper contact pattern 81 located at a higher level than the interconnection structure 51 may be disposed. The upper capping pattern 90 may be formed of silicon nitride.

The second source/drain region 24*b* may overlap the contact structure 84, the insulating spacer structure 88, and the interconnection structure 51.

An insulating isolation pattern 69 may be disposed between interconnection structures 51 adjacent to each other and between contact structures 84 adjacent to each other. The insulating isolation pattern 69 may be formed of silicon nitride.

In at least one example embodiment, the insulating isolation pattern 69 may be disposed on the buffer insulation layer 27 on the gate capping pattern 18.

In at least one example embodiment, the first and second side surfaces S1 and S2 may have different lengths from the third and fourth side surfaces S3 and S4 in the active region 6. The active region 6 may have a width of the first direction (the X direction) different from a width of the second direction (the Y direction). Hereinafter, referring to FIGS. 5A and 5B, an active region having different widths in a first direction (an X direction) and in a second direction (a Y direction) will be described.

Figure 5A:
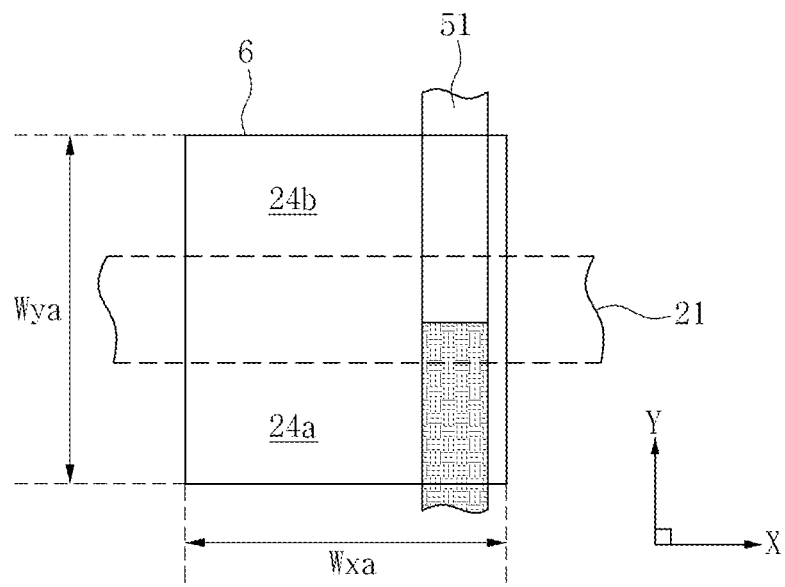
FIG. 5A is a plan view illustrating a semiconductor device in accordance with at least one example embodiment of the inventive concepts.

Referring to FIG. 5A, the active region 6 may have a width (Wya) in the second direction (the Y direction) greater than a width (Wxa) in the first direction (the X direction). Therefore, a process margin configured to form the gate structure 21 may be ensured even more.

Figure 5B:
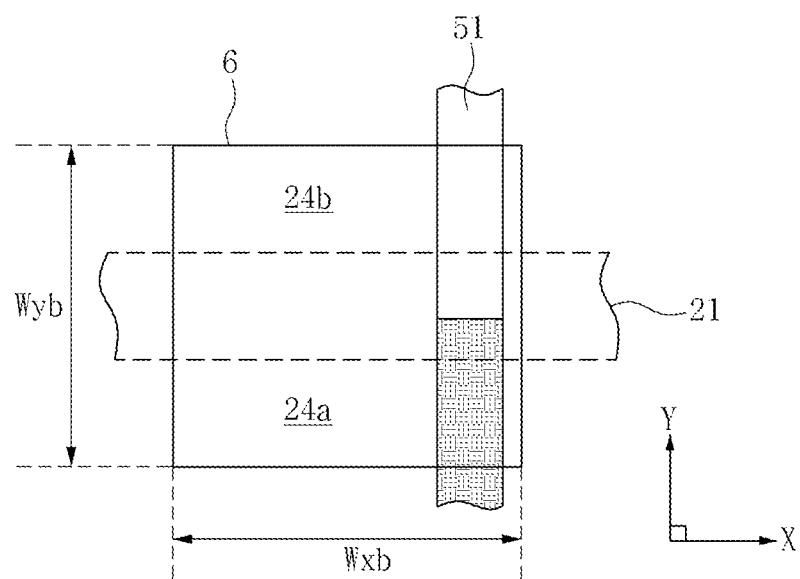
FIG. 5B is a plan view illustrating a semiconductor device in accordance with at least one example embodiment of the inventive concepts.

Referring to FIG. 5B, the active region 6 may have a width (Wxb) in the first direction (the X direction) greater than a width (Wyb) in the second direction (the Y direction). Therefore, a process margin when forming the interconnection structure 51 may be ensured even more.

Arrangements and shapes of the insulating isolation pattern 69 and the contact structure 84 are not limited to the above-described embodiment. Hereinafter, referring to FIGS. 6, 7A, and 7B, examples on modifications of the insulating isolation pattern 69 and the contact structure 84 will be described.

Figure 6:
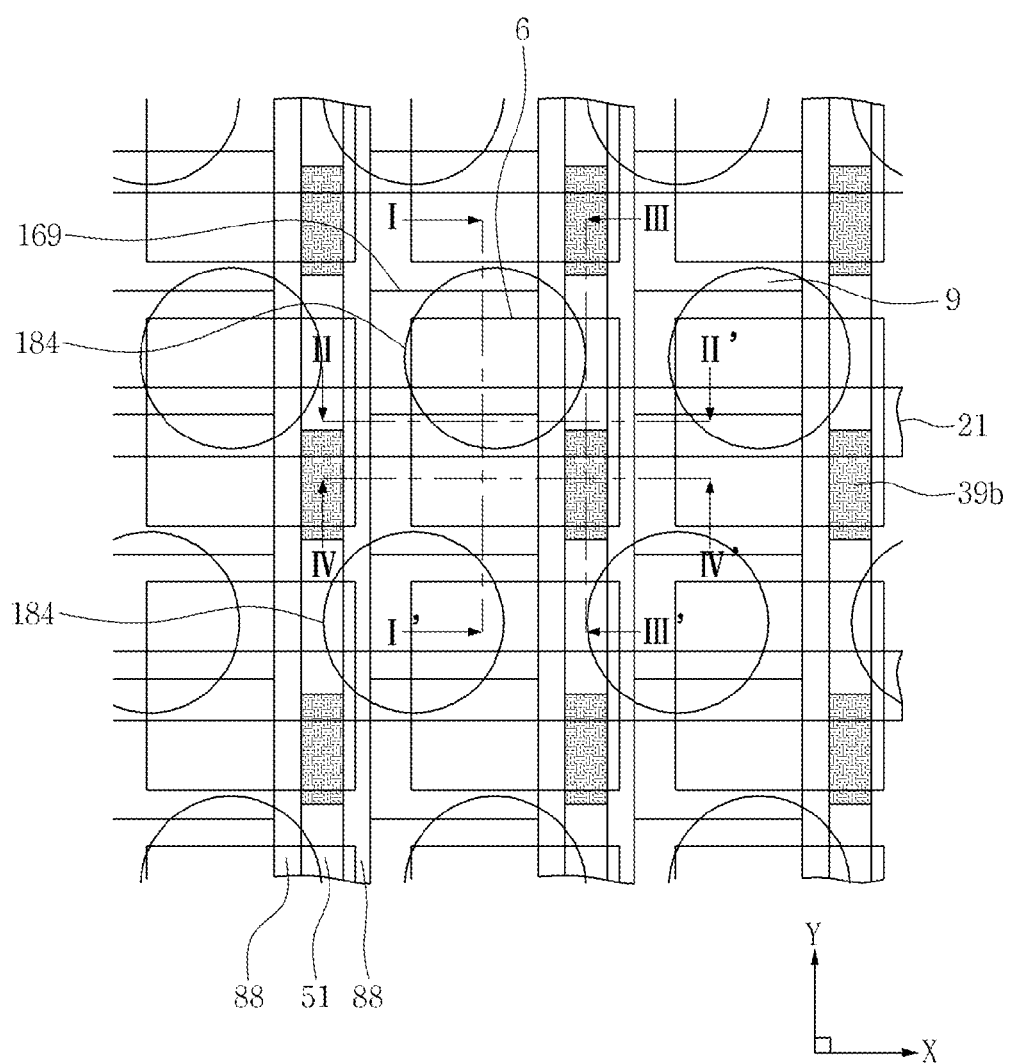
FIG. 6 is a plan view illustrating a semiconductor device in accordance with at least one example embodiment of the inventive concepts.
Figure 7A:
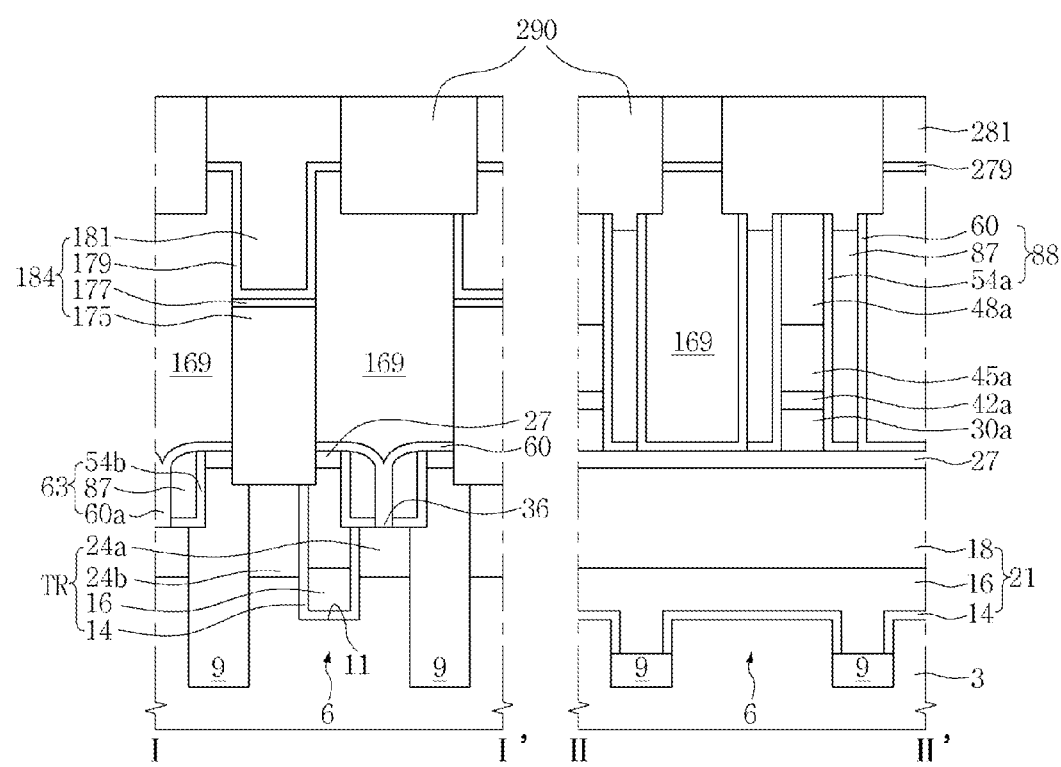
FIGS. 7A and 7B are cross-sectional views illustrating a semiconductor device in accordance with at least one example embodiment of the inventive concepts.
Figure 7B:
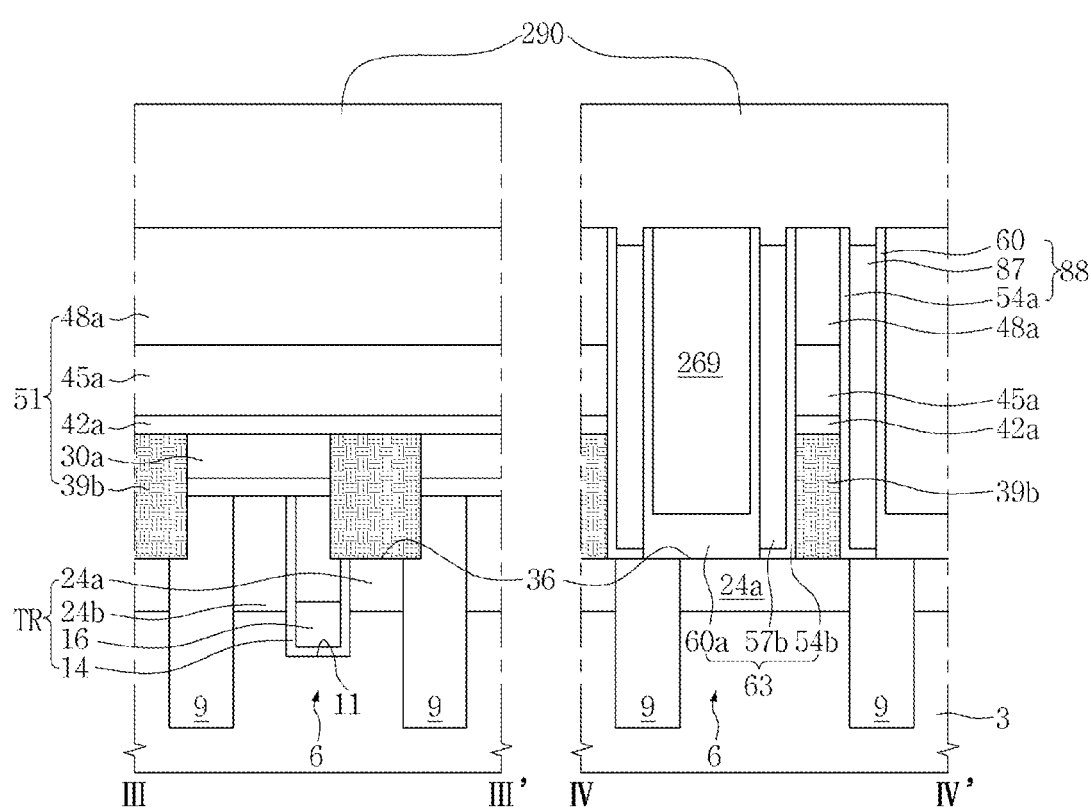

Referring to FIGS. 6, 7A, and 7B, the semiconductor substrate 3, a TR, the gate structure 21, the buffer insulation layer 27, the groove 36, the interconnection structure 51, and the insulating spacer structure 88, which are the same as described above with reference to FIGS. 1, 2, 3, 4A, and 4B, may be provided.

A contact structure 184 overlapping the second upper surface 24*b*_s2 of the second source/drain region 24*b* and electrically connected to the second source/drain region 24*b* may be disposed. The contact structure 184 may overlap the second source/drain region 24*b* and may not overlap the first source/drain region 24*a*. A bottom surface of the contact structure 184 may be disposed at a higher level than a bottom surface of the contact conductive pattern 39*b* of the interconnection structure 51.

The contact structure 184 may include a lower contact pattern 175, a metal silicide layer 177, a barrier pattern 179, and an upper contact pattern 181. The lower contact pattern 175 may contact the second source/drain region 24*b* and be electrically connected to the second source/drain region 24*b*. The metal silicide layer 177 may be disposed on the lower contact pattern 175. The upper contact pattern 181 may be disposed on the metal silicide layer 177. The barrier pattern 179 may be disposed between the upper contact pattern 181 and the metal silicide layer 177 and extend to a side surface of the upper contact pattern 181. The upper contact pattern 181 may have a portion located at a higher level than the interconnection structure 151.

An upper capping pattern 190 configured to surround a side surface of the upper contact pattern 181 located at a higher level than the interconnection structure 151 may be disposed. The upper capping pattern 190 may be formed of silicon nitride.

An insulating isolation pattern 169 may be disposed between interconnection structures 51 adjacent to each other and between contact structures 184 adjacent to each other. The insulating isolation pattern 169 may be formed of silicon nitride. The insulating isolation pattern 169 adjacent to the interconnection structure 51 may overlap the first source/drain region 24a and the gate structure 21.

In accordance with at least one example embodiment of the inventive concepts, a contact area of the active region 6, for example a contact area between the second source/drain region 24b and the contact structure 184, may be increased. Therefore, a reliability of a contact between the second source/drain region 24b and the contact structure 184 may be improved.

In accordance with at least one example embodiment of the inventive concepts, the contact conductive pattern 39b of the interconnection structure 51 for electrically connecting the interconnection structure 51 to a contact area of the active region 6, for example, the first source/drain region 24a, may be reliably formed.

In accordance with at least one example embodiment of the inventive concepts, a channel width of the TR may be increased.

Referring to FIGS. 8 to 27B and 28A to 29B, methods of forming a semiconductor device in accordance with at least one example embodiment of the inventive concepts will be described.

FIGS. 8, 10, 15, and 19 are plan views illustrating a method of forming a semiconductor device in accordance with at least one example embodiment of the inventive concepts, and FIGS. 9A, 9B, 11A, 11B, 12A, 12B, 13A, 13B, 14A, 14B, 16A, 16B, 17A, 17B, 18A, 18B, 20A, 20B, 21A, 21B, 22A, 22B, 23A, 23B, 24A, 24B, 25A, 25B, 26A, 26B, 27A, and 27B are cross-sectional views illustrating a method of forming a semiconductor device in accordance with at least one example embodiment of the inventive concepts. FIGS. 9A, 11A, 12A, 13A, 14A, 16A, 17A, 18A, 20A, 21A, 22A, 23A, 24A, 25A, 26A, and 27A are cross-sectional views illustrating a region taken along line I-I' and a region taken along line II-II' of FIGS. 1, 8, 10, 15, and 19, and FIGS. 9B, 11B, 12B, 13B, 14B, 16B, 17B, 18B, 20B, 21B, 22B, 23B, 24B, 25B, 26B, and 27B are cross-sectional views illustrating a region taken along line III-III' and a region taken along line IV-IV' of FIGS. 1, 8, 10, 15, and 19.

Figure 28A:
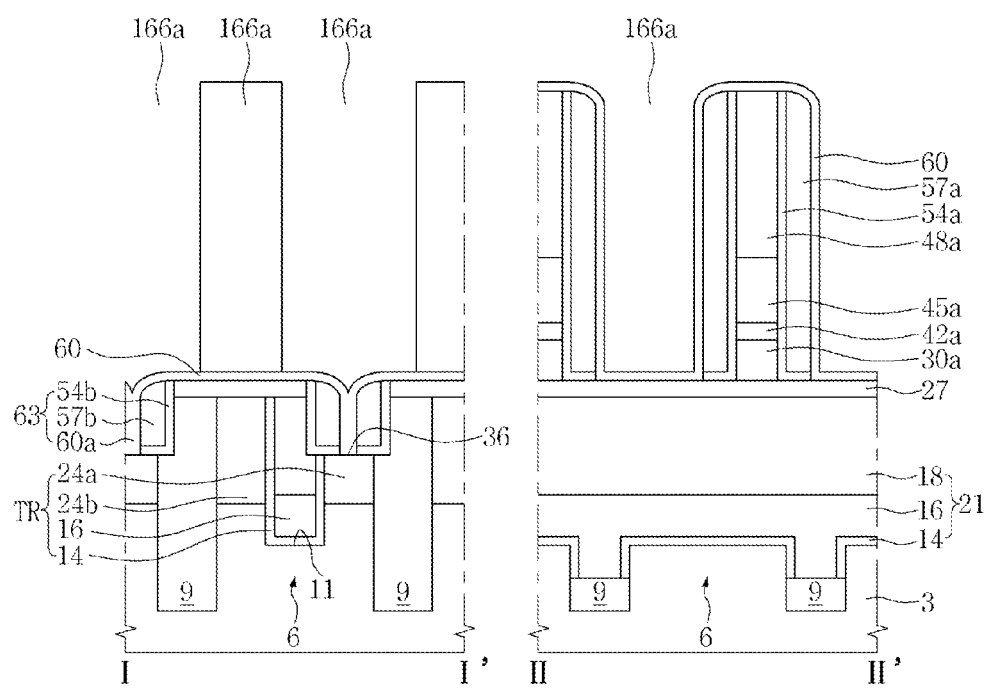
FIGS. 28A to 29B are cross-sectional views illustrating a method of forming a semiconductor device in accordance with at least one example embodiment of the inventive concepts.
Figure 28B:
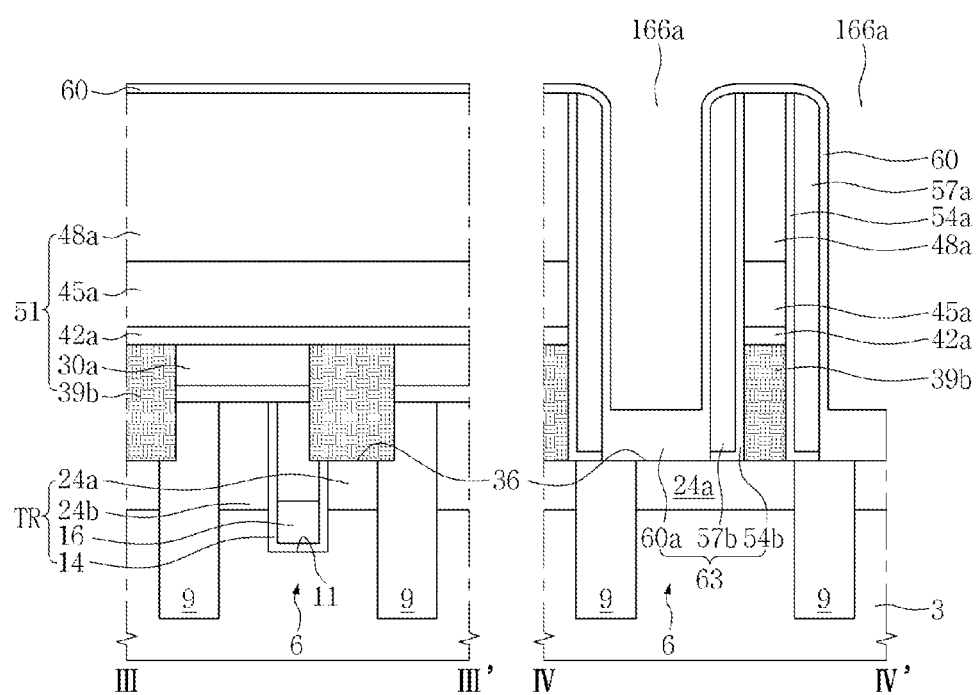
Figure 29A:
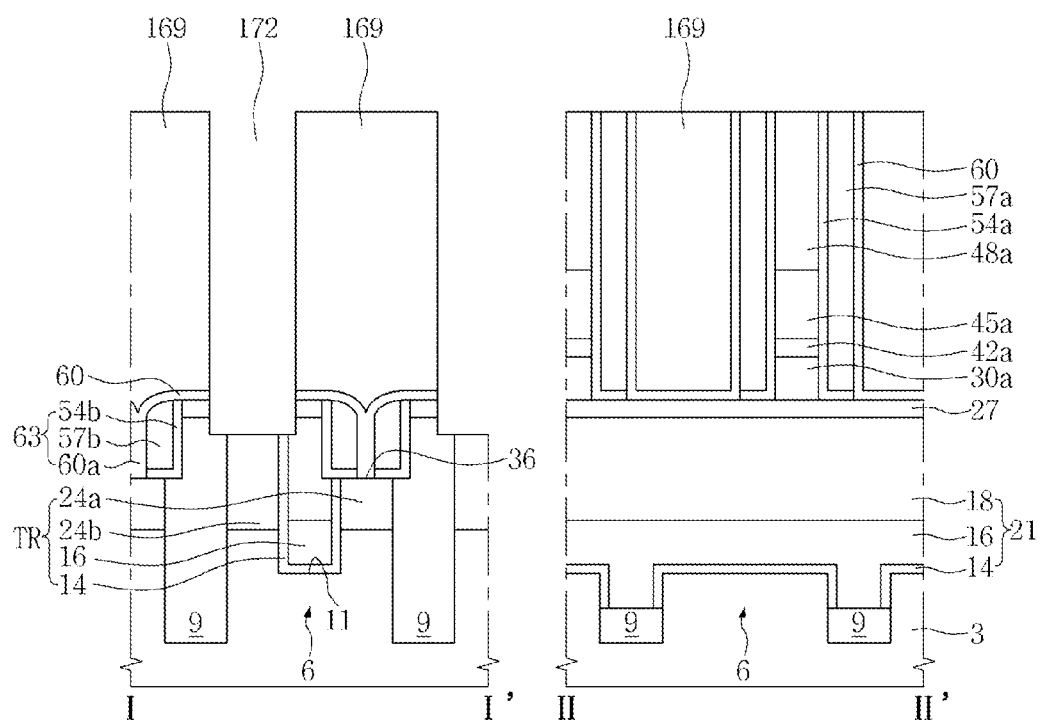
Figure 29B:
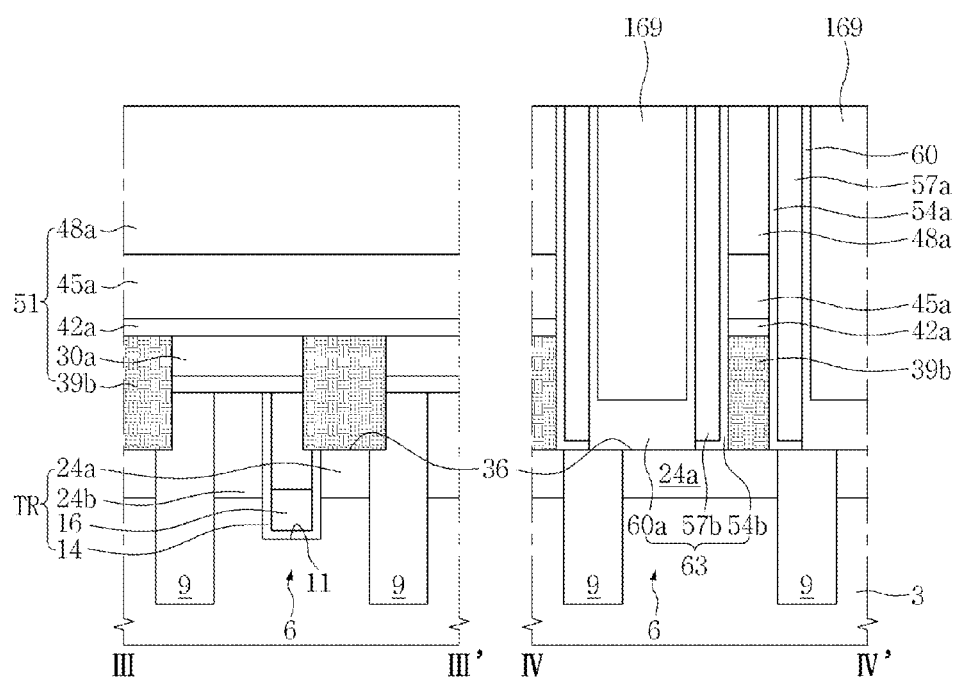

FIGS. 28A, 28B, 29A, and 29B are cross-sectional views illustrating a method of forming a semiconductor device in accordance with at least one example embodiment of the inventive concepts. FIGS. 28A and 29A are cross-sectional views illustrating a region taken along line I-I' and a region taken along line II-II' of FIG. 6, and FIGS. 28B and 29B are cross-sectional views illustrating a region taken along line III-III' and a region taken along line IV-IV' of FIG. 6.

A method of forming the semiconductor device illustrated in FIGS. 1, 2, 3, 4A, and 4B will be described with reference to FIGS. 8 to 27B.

Figure 8:
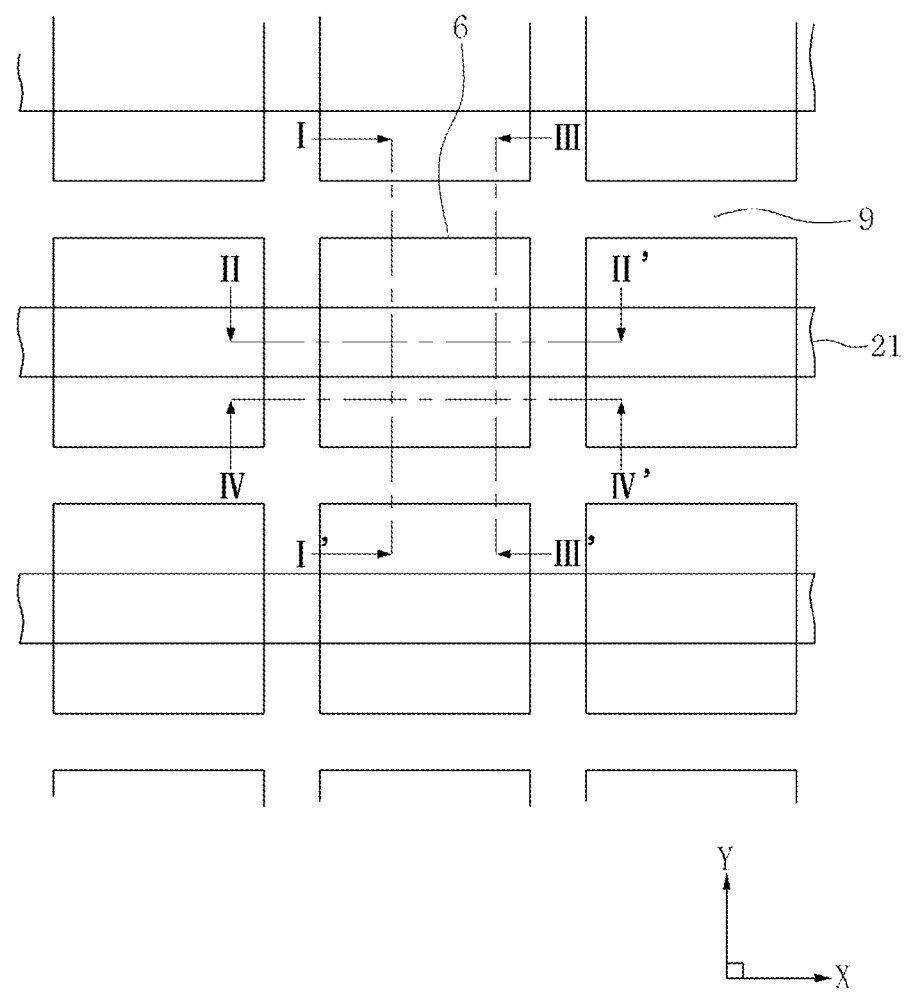
FIGS. 8 to 27B are cross-sectional views illustrating a semiconductor device in accordance with at least one example embodiment of the inventive concepts.
Figure 9A:
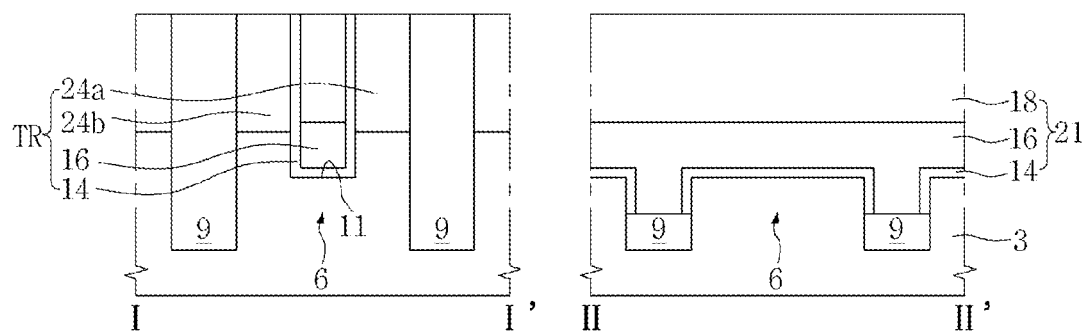
Figure 9B:
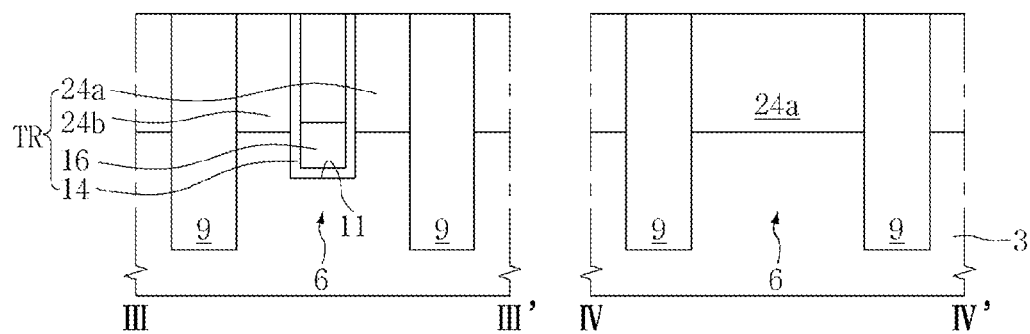

Referring to FIGS. 8, 9A, and 9B, a semiconductor substrate 3 may be prepared. The semiconductor substrate 3 may be a semiconductor substrate formed of a semiconductor material such as silicon. An isolation region 9 configured to define an active region 6 may be formed in the semiconductor substrate 3. The isolation region 9 may be a shallow trench device isolation layer.

The isolation region 9 may include first and second isolation lines 9a and 9b in parallel and extending in a first direction (an X direction), and third and fourth isolation lines 9c and 9d in parallel and extending in a second direction (an Y direction) perpendicular to the first direction (the X direction). The first and second isolation lines 9a and 9b may vertically cross the third and fourth isolation lines 9c and 9d.

The formation of the isolation region 9 may include forming field trenches configured to define the active region 6 in the semiconductor substrate 3, and forming an insulating material layer configured to fill the field trenches. The insulating material layer may include an insulating material such as, for example, silicon oxide, silicon oxy-nitride, or silicon nitride.

TRs may be formed in the substrate 3. Each of the TRs may include gate electrodes 16 in gate trenches 11 cross the active region 6 and extend into the isolation region 9, first and second source/drain regions 24a and 24b formed in the active region 6 on both sides of the gate electrodes 16, and a gate dielectric layer 14 formed between the gate electrodes 16 and the active region 6.

An insulating gate capping pattern 18 may be formed on the gate electrodes 16. The gate dielectric layer 14, the gate electrodes 16, and the gate capping pattern 18 formed in the gate trenches 11 may form a gate structure 21.

Formation of the first source/drain region 24a and the second source/drain region 24b may include implanting impurities in the active region 6 using an ion implantation process before forming the gate trenches 11, and/or after forming the gate structure 21.

Figure 10:
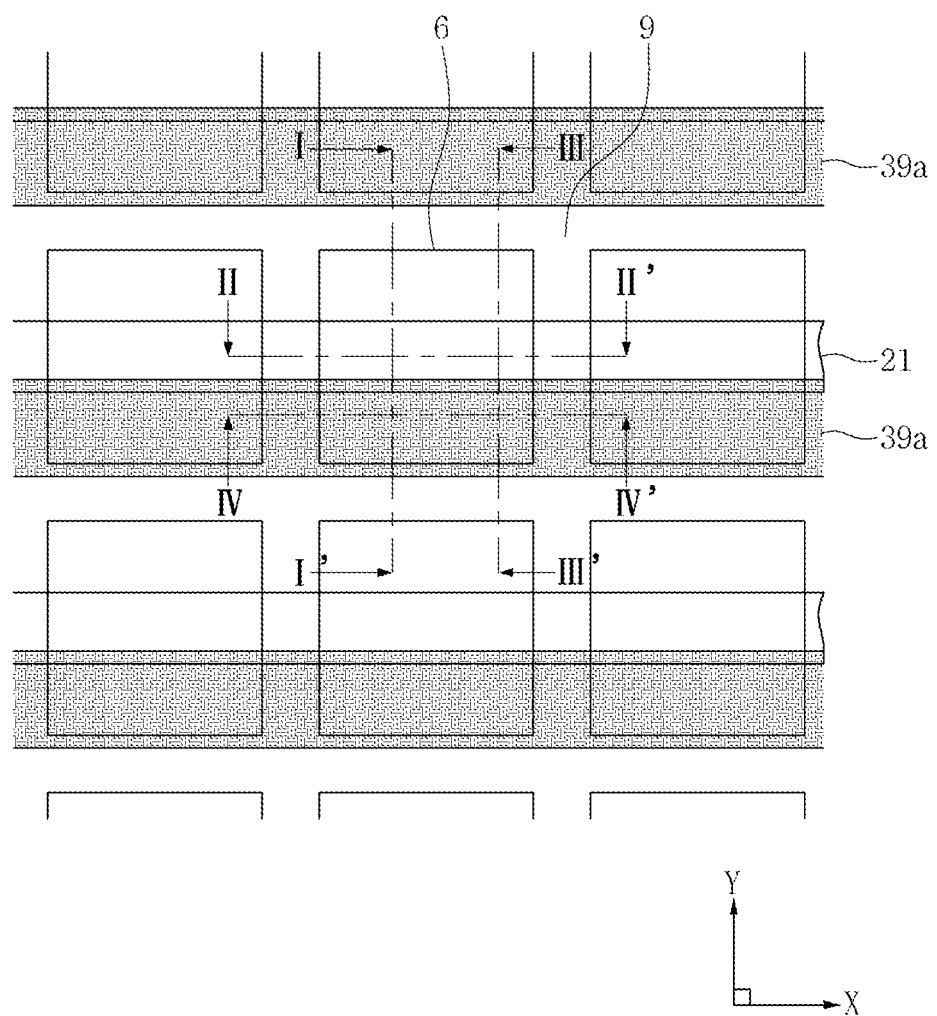
Figure 11A:
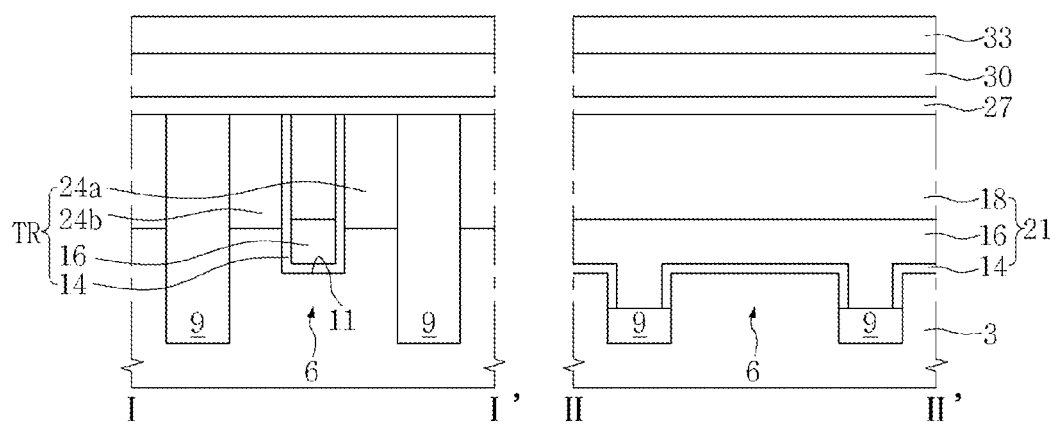
Figure 11B:
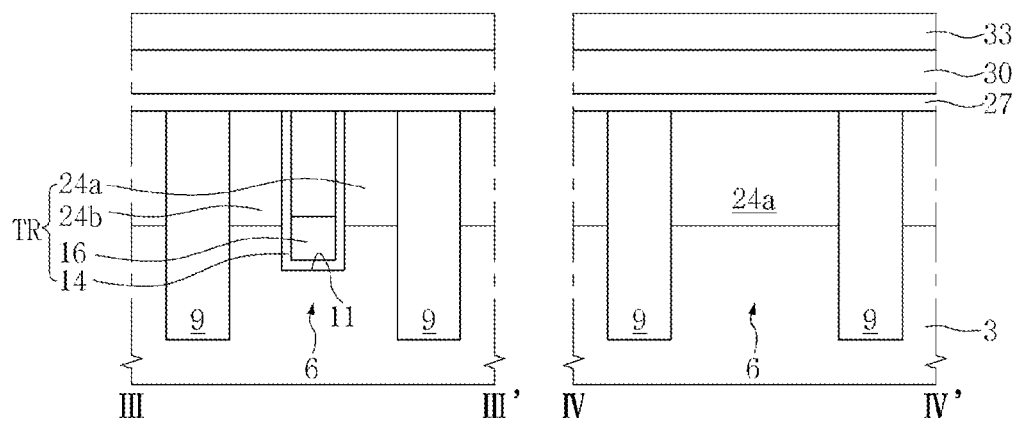

Referring to FIGS. 10, 11A, and 11B, a buffer insulation layer 27 may be formed on a substrate having the TRs. The buffer insulation layer 27 may be formed of silicon oxide and/or silicon nitride. A first conductive layer 30 and mask layer 33 may be formed on the buffer insulation layer 27.

Figure 12A:
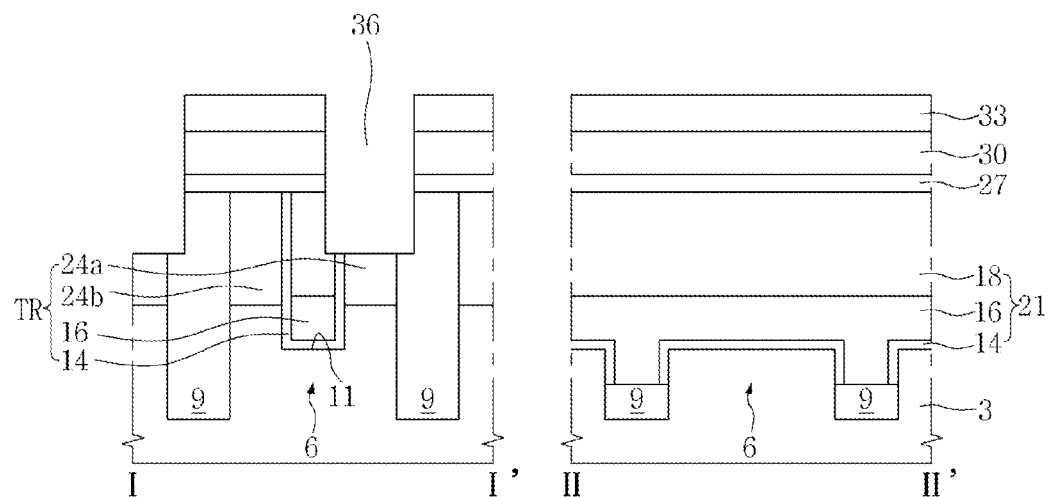
Figure 12B:
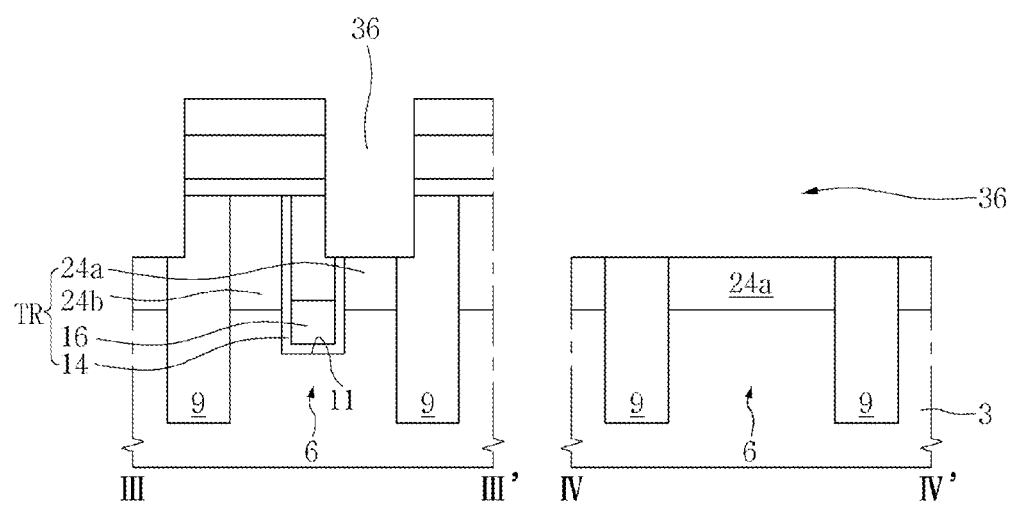

Referring to FIGS. 10, 12A, and 12B, a groove 36 passing through the mask layer 33, the lower conductive layer 30, and the buffer insulation layer 27 may be formed to expose the first source/drain region 24a.

In at least one example embodiment, the groove 36 may pass through the mask layer 33, the lower conductive layer 30, and the buffer insulation layer 27 and extend into the active region 6. Therefore, a bottom surface of the groove 36 may be formed at a lower level than an upper end of the second source/drain region 24b of the active region 6.

In at least one example embodiment, the formation of the groove 36 may include patterning the mask layer 33, sequentially etching the lower conductive layer 30 under the patterned mask layer 33 and the buffer insulation layer 27, and then partially etching the exposed first source/drain region 24a and partially etching the gate capping pattern 18 and the isolation region 9.

Figure 13A:
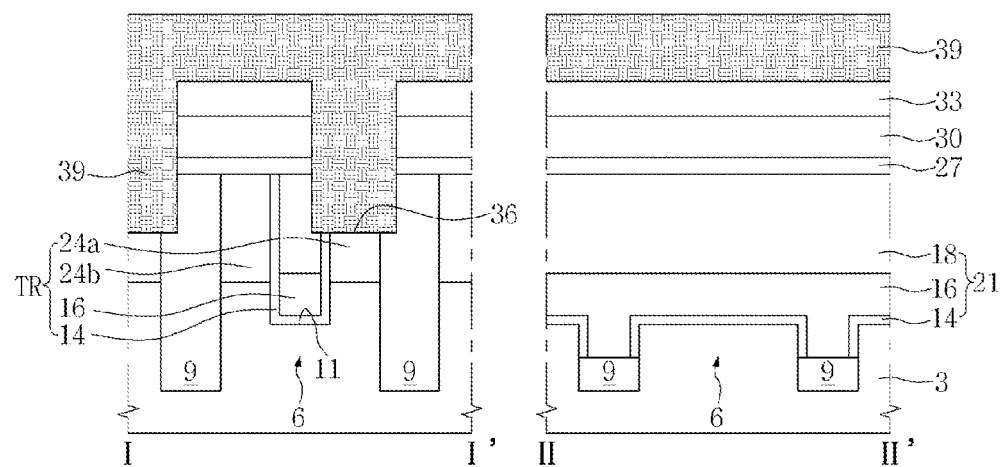
Figure 13B:
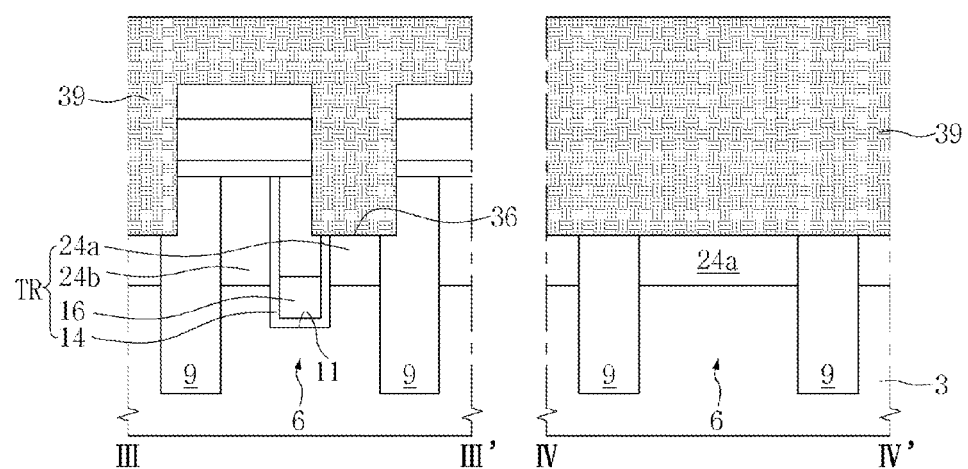

Referring to FIGS. 10, 13A, and 13B, a contact conductive layer 39 may be formed to fill the groove 36 and cover the mask layer 33. The lower conductive layer 30 may be formed of polysilicon. The contact conductive layer 39 may be formed of polysilicon.

Figure 14A:
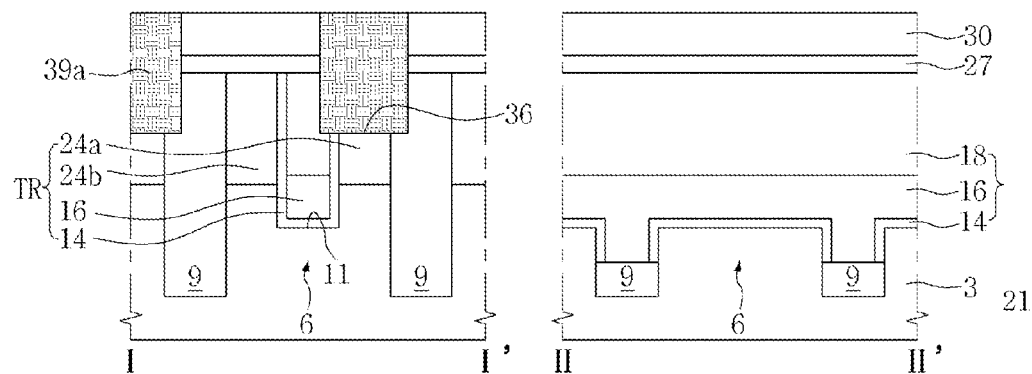
Figure 14B:
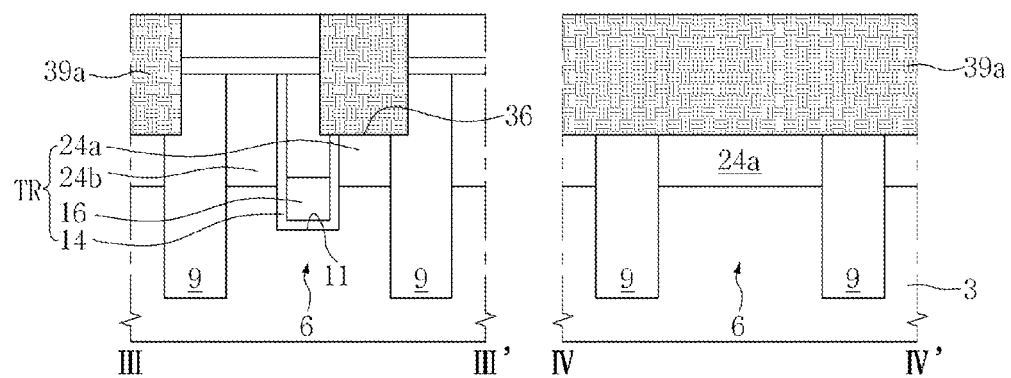

Referring to FIGS. 10, 14A, and 14B, contact conductive line 39a may be formed by planarizing the contact conductive layer 39 until exposing the lower conductive layer 30. For example, the formation of the contact conductive line 39a may include performing an etch-back process, etching the contact conductive layer 39, and then etching and removing the mask layer 33 and exposing the lower conductive layer 30.

Figure 15:
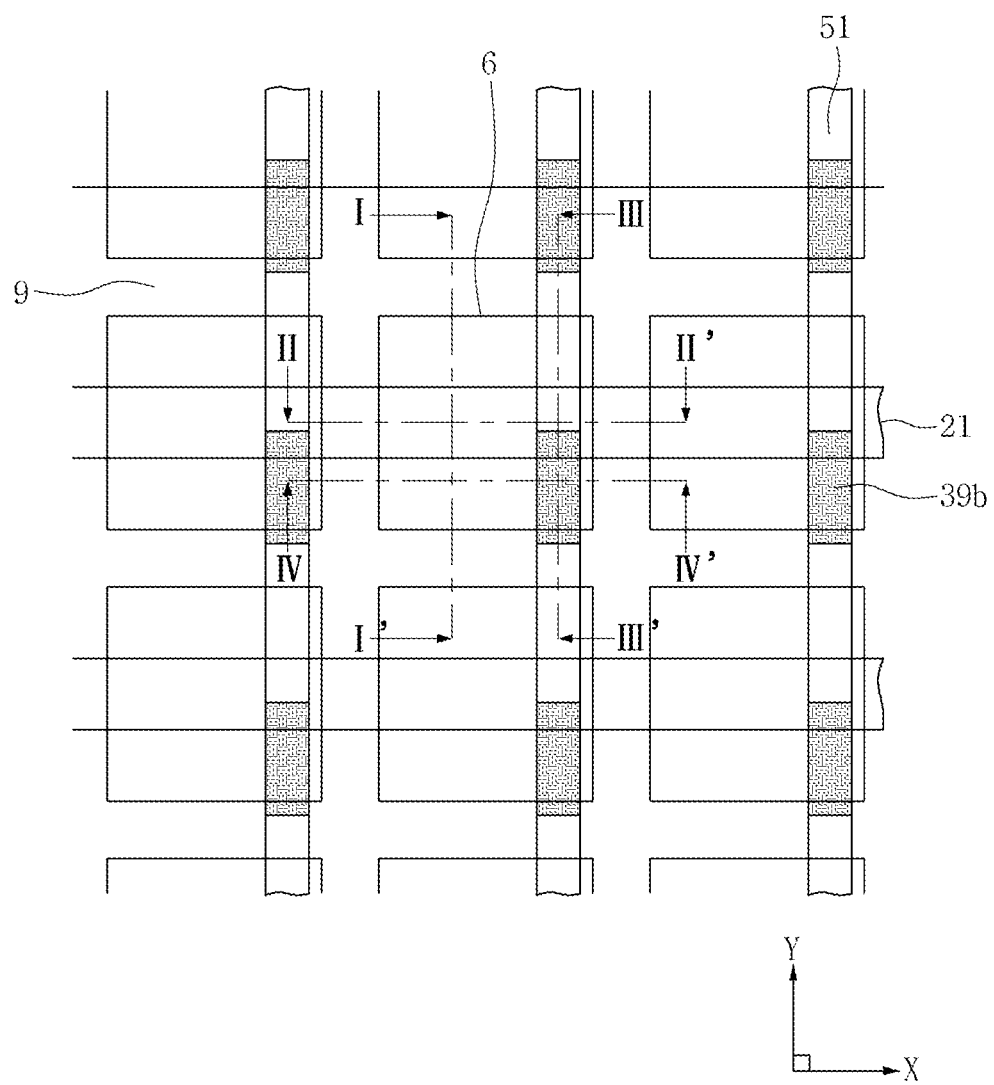
Figure 16A:
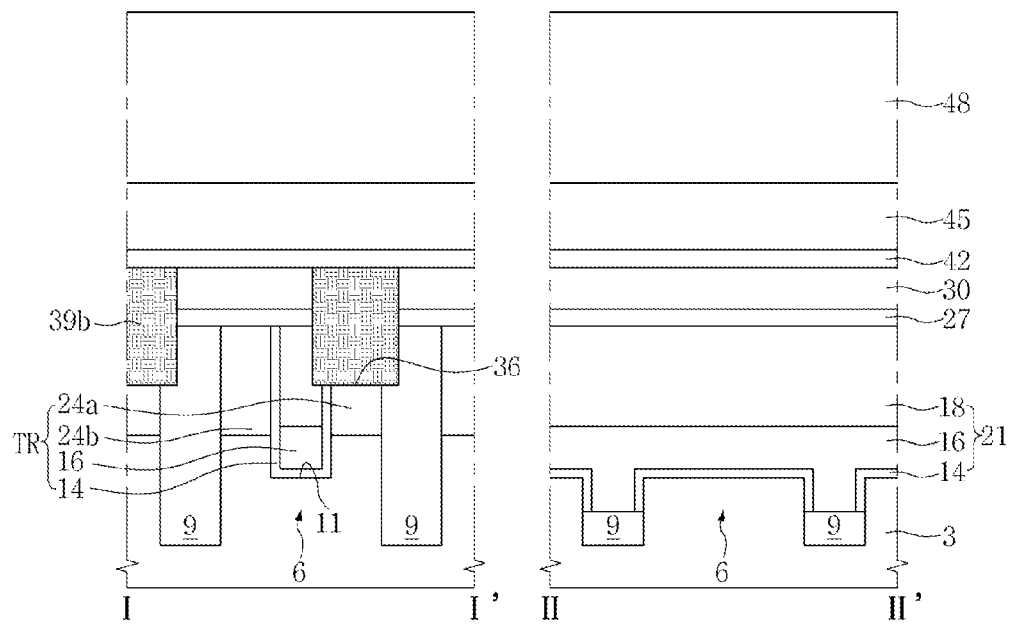
Figure 16B:
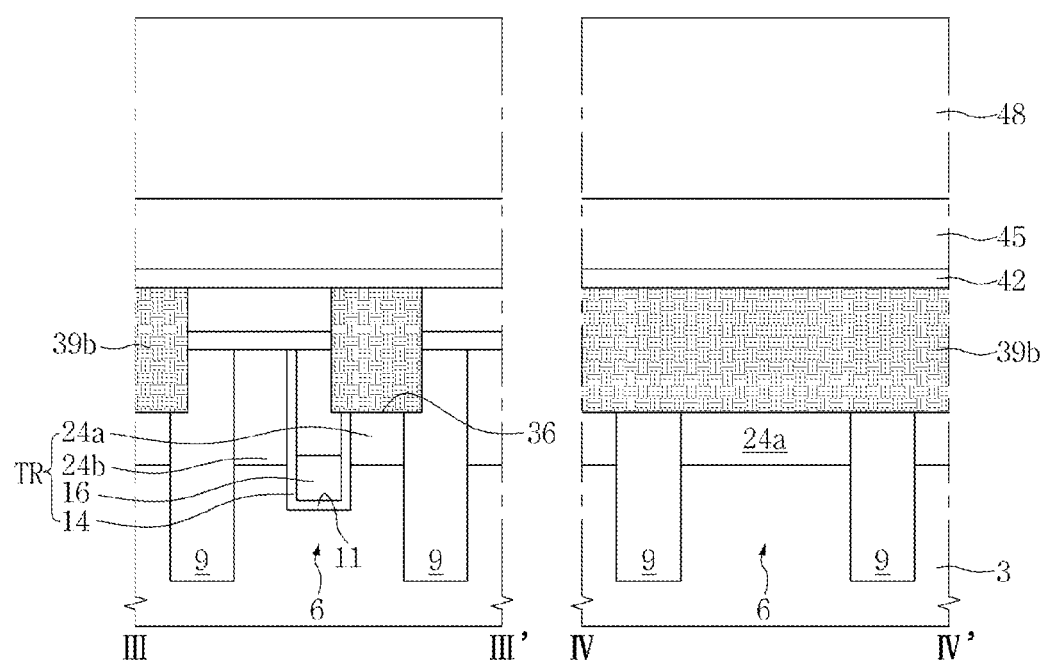

Referring to FIGS. 15, 16A, and 16B, a middle conductive layer 42, an upper conductive layer 45, and an insulating capping layer 48 may be sequentially formed on a substrate having the lower conductive layer 30 and the contact conductive line 39a. The middle conductive layer 42 may include a metal nitride layer and/or a metal silicide layer. The upper conductive layer 45 may include a metal layer formed of tungsten. The insulating capping layer 48 may be formed of an insulating material such as silicon nitride.

Figure 17A:
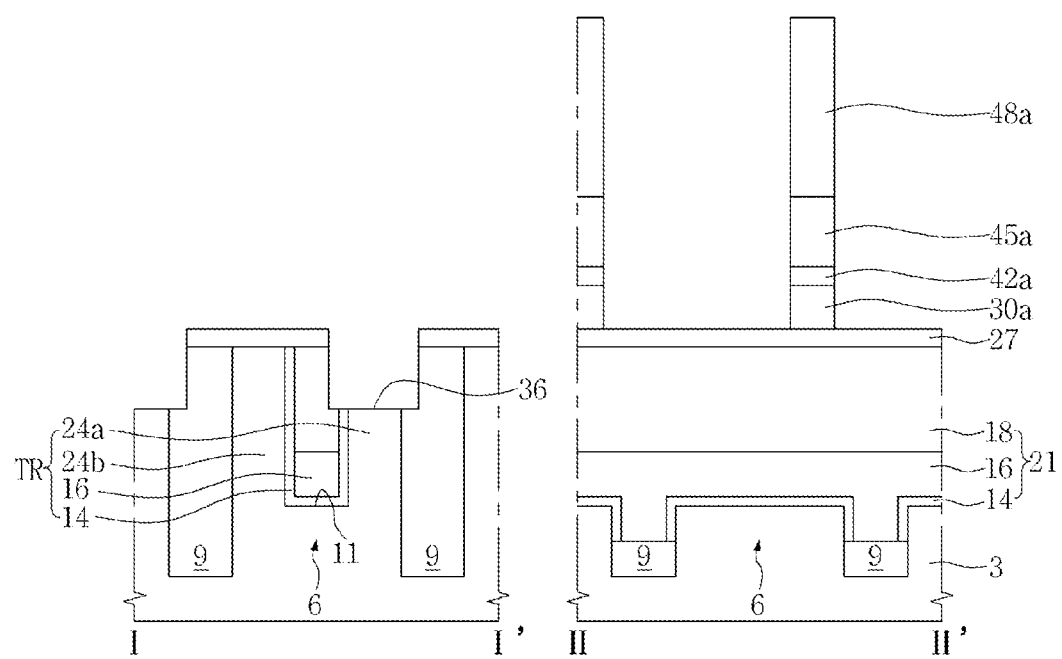
Figure 17B:
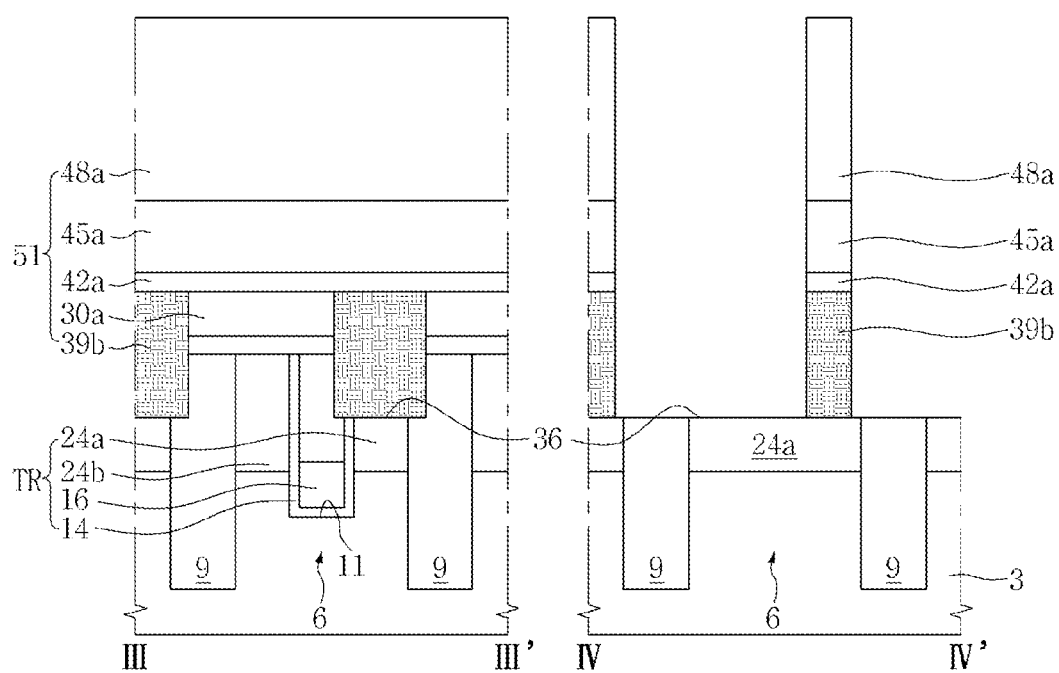

Referring to FIGS. 15, 17A, and 17B, an insulating capping pattern 48a may be formed by patterning the insulating capping layer 48. An upper conductive pattern 45a, a middle conductive pattern 42a, a lower conductive pattern 30a, and a contact conductive pattern 39b may be formed by sequentially etching the upper conductive layer 45, the middle conductive layer 42, the lower conductive layer 30, and the contact conductive line 39a using the insulating capping pattern 48a as an etching mask. The contact conductive pattern 39b may overlap the first source/drain region 24a and may be electrically connected to the first source/drain region 24a. The lower conductive pattern 30a may overlap the second source/drain region 24b and may be spaced apart from the second source/drain region 24b. The middle conductive pattern 42a and the upper conductive pattern 45a may be sequentially stacked and may cover the contact conductive pattern 39b and the lower conductive pattern 30a. The contact conductive pattern 39b, the lower conductive pattern 30a, the middle conductive pattern 42a, the upper conductive pattern 45a, and the insulating capping pattern 48a may form an interconnection structure 51.

Figure 18A:
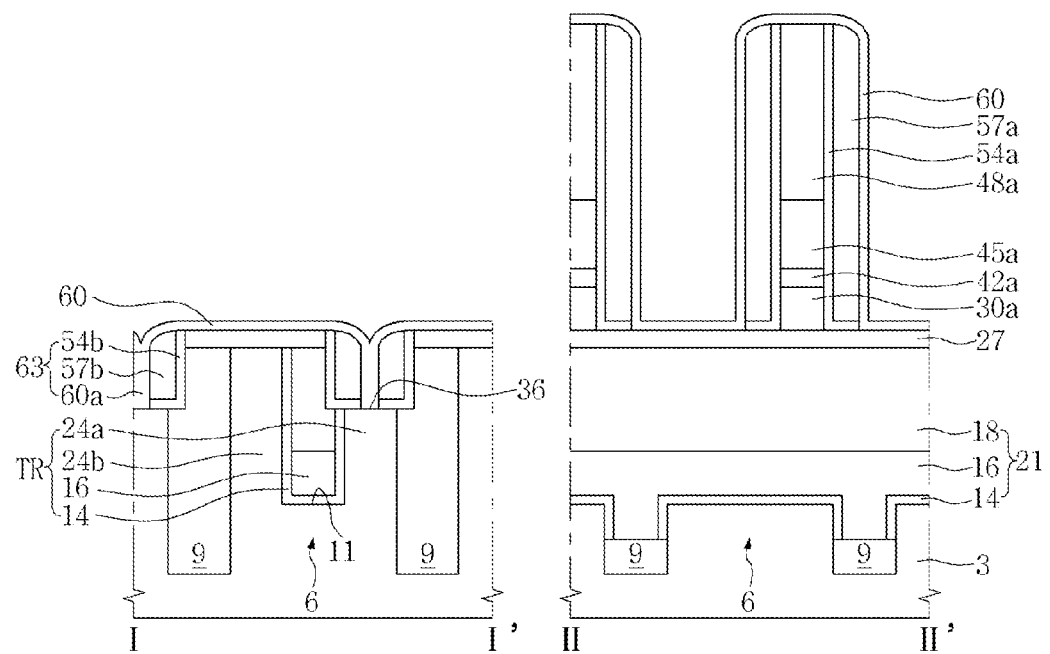
Figure 18B:
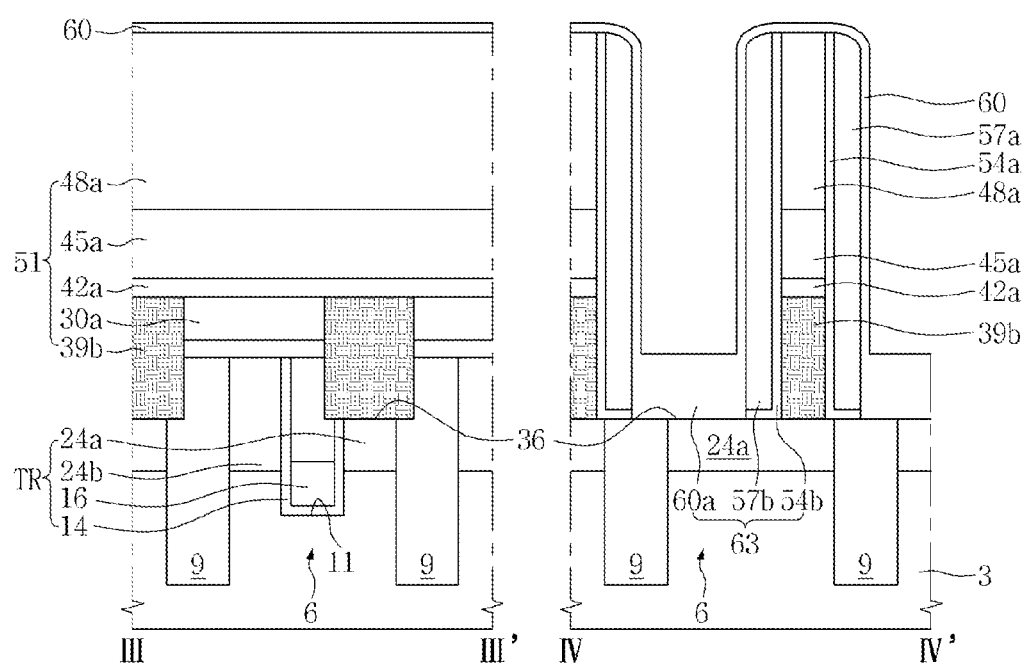

Referring to FIGS. 15, 18A, and 18B, a first spacer layer and a second spacer layer may be sequentially formed on a substrate having the interconnection structure 51, and the first and second spacer layers may be anisotropically etched. After the first and second spacer layers are anisotropically etched, the first and second spacer layers may be respectively formed as a first spacer 54a and a second spacer 57a on a side surface of the interconnection structure 51, and/or respectively formed as a first gap-fill pattern 54b and a second gap-fill pattern 57b in the groove 36. The first spacer 54a may be referred to as an inner spacer.

A passivation layer 60 may be formed on a substrate having the first and second spacers 54a and 57a and the first and second gap-fill patterns 54b and 57b. The passivation layer 60 may be referred to as a third spacer or an outer spacer on the side surfaces of the interconnection structure 51, and referred to as a third gap-fill pattern 60a in the groove 36. The first to third gap-fill patterns 54b, 57b, and 60a filling the groove 36 may constitute an insulating structure 63.

Figure 19:
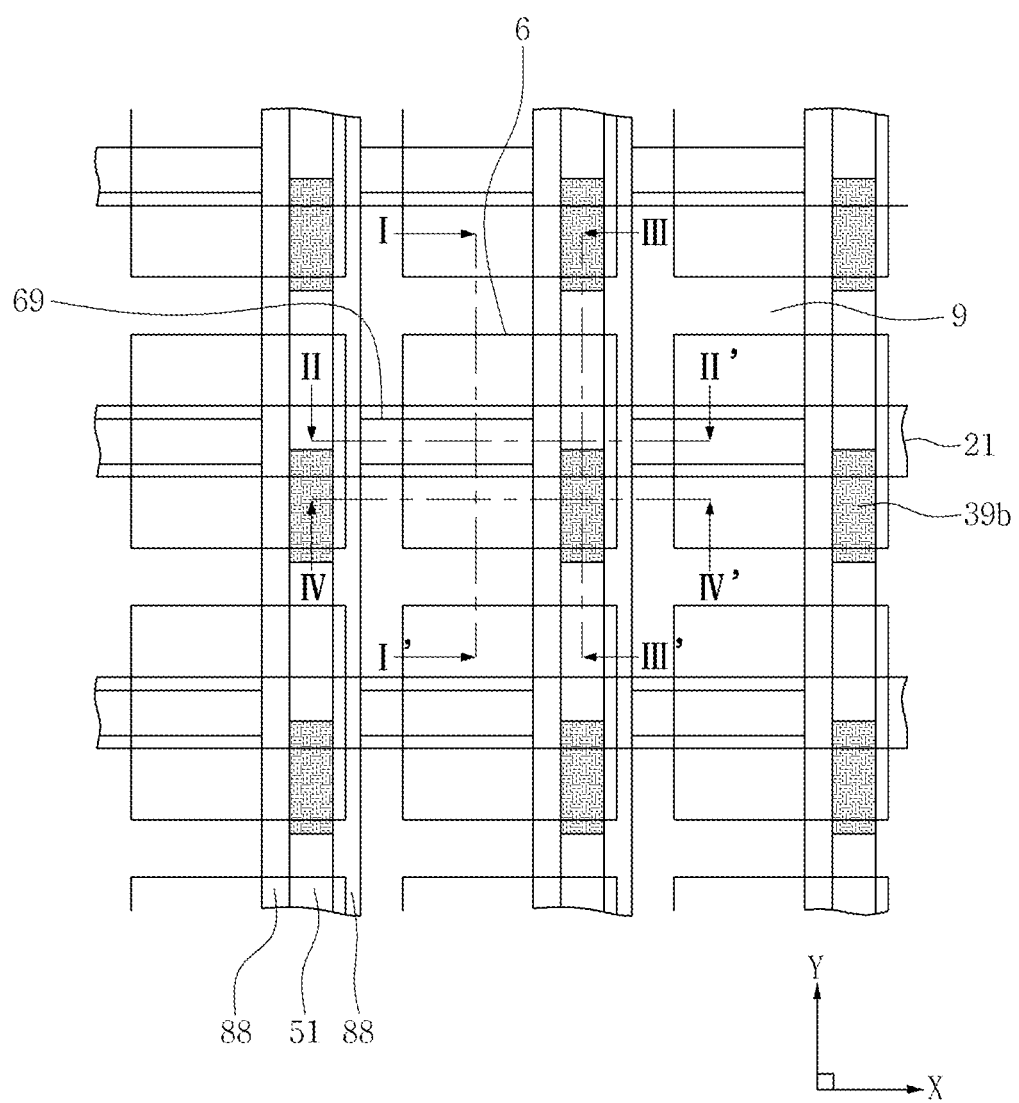
Figure 20A:
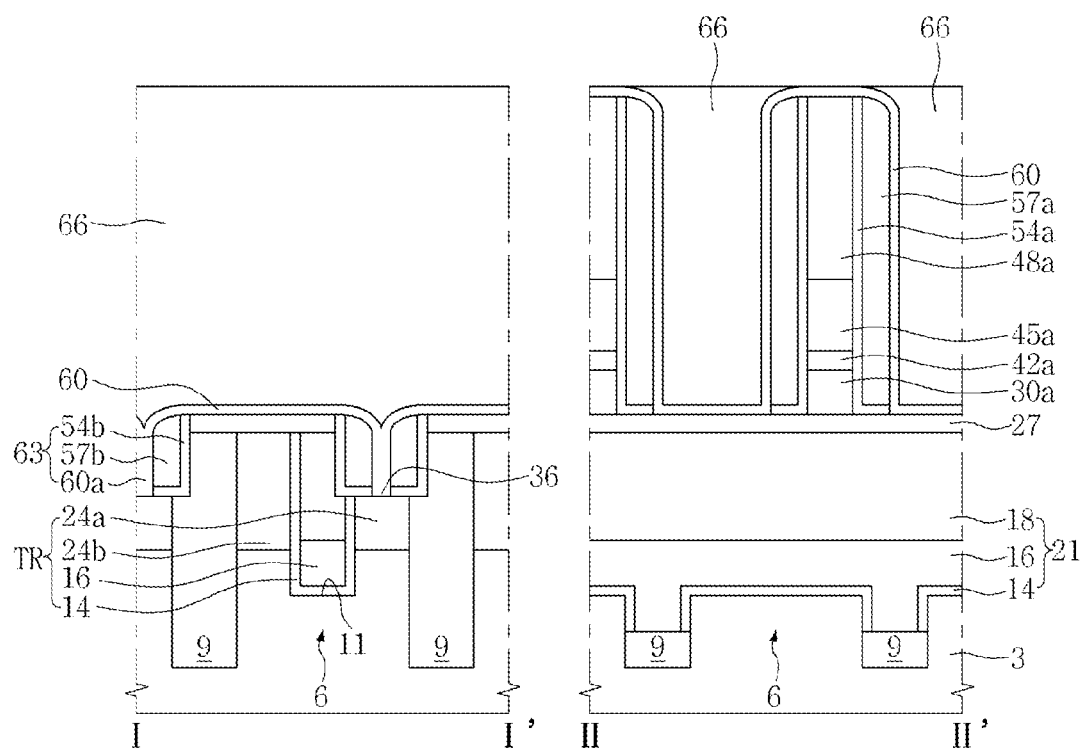
Figure 20B:
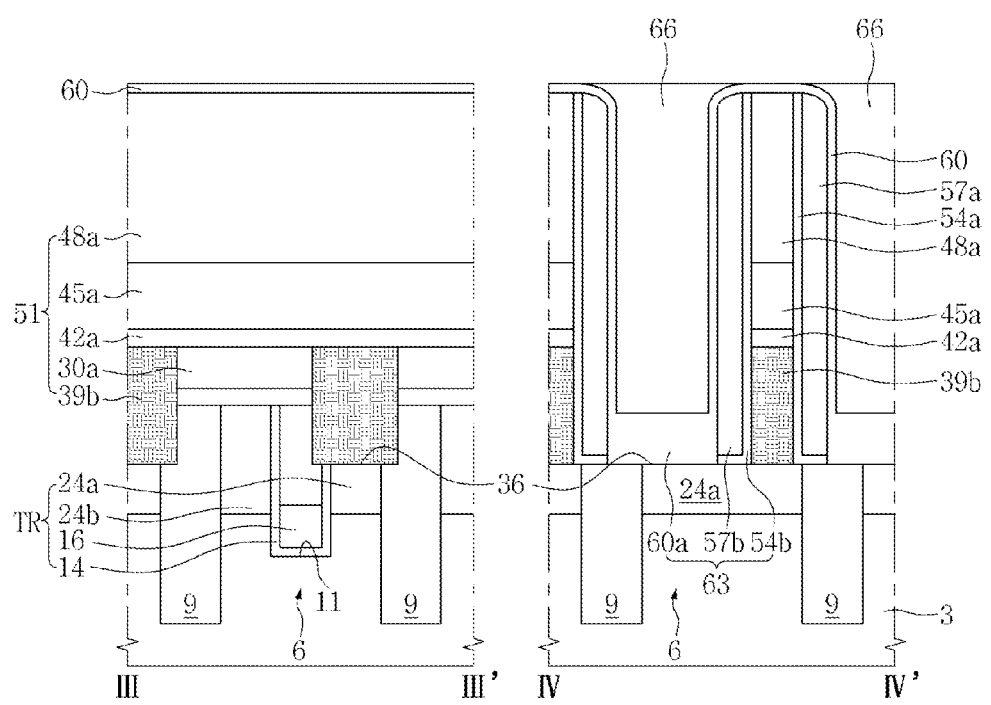

Referring to FIGS. 19, 20A, and 20B, a molding layer 66 may be formed on a substrate having the passivation layer 60. The molding layer 66 may be formed between the interconnection structures 51. The molding layer 66 may be formed of silicon oxide.

Figure 21A:
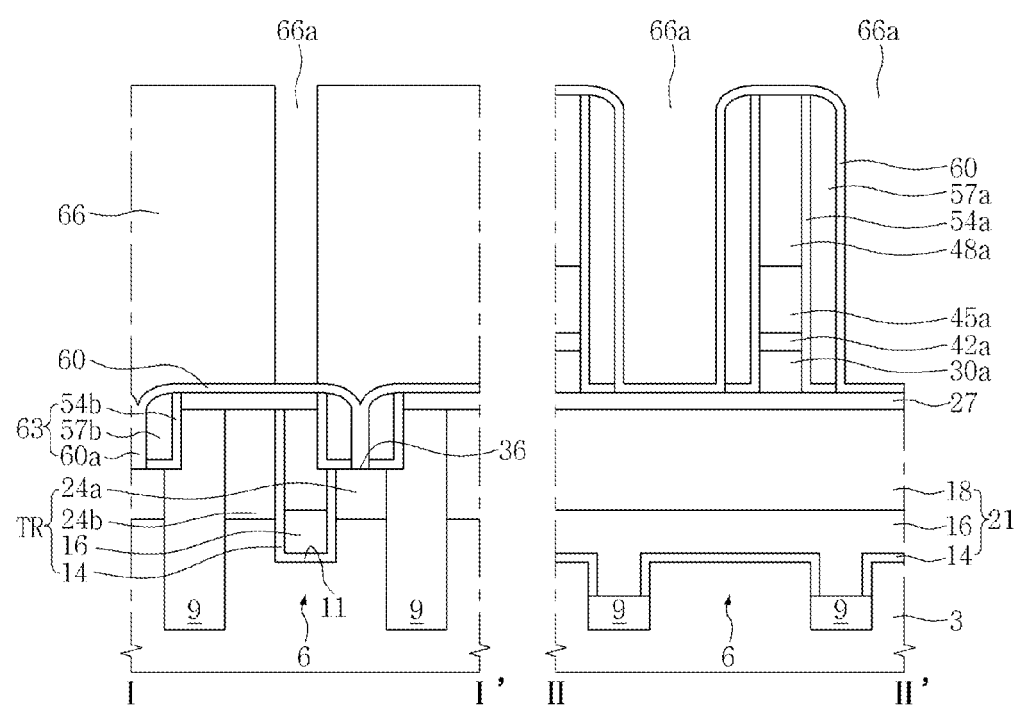
Figure 21B:
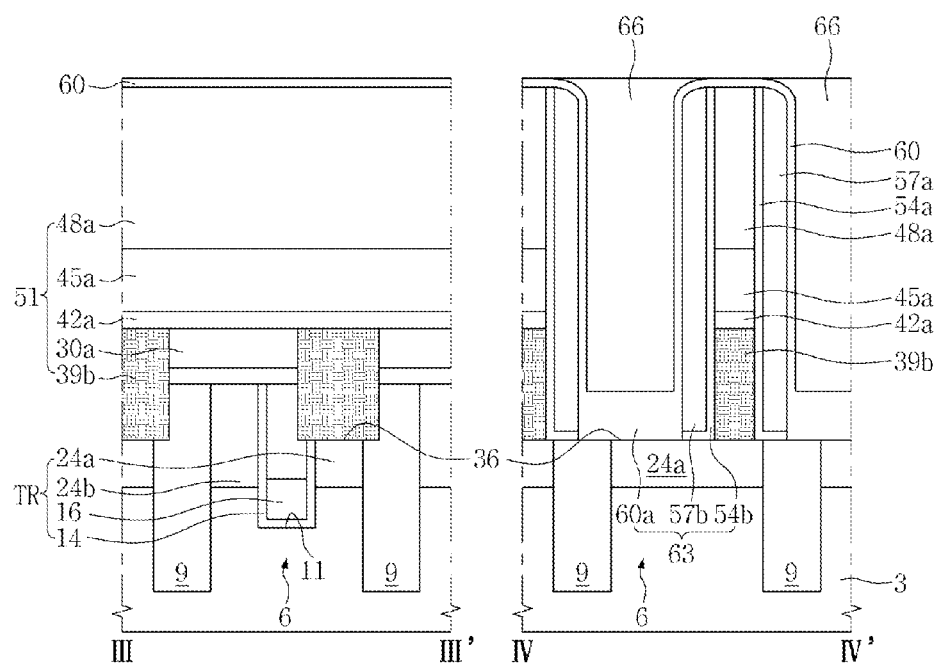

Referring to FIGS. 19, 21A, and 21B, a separation hole 66a may be formed by patterning the molding layer 66. The separation hole 66a may be formed between the interconnection structures 51.

Figure 22A:
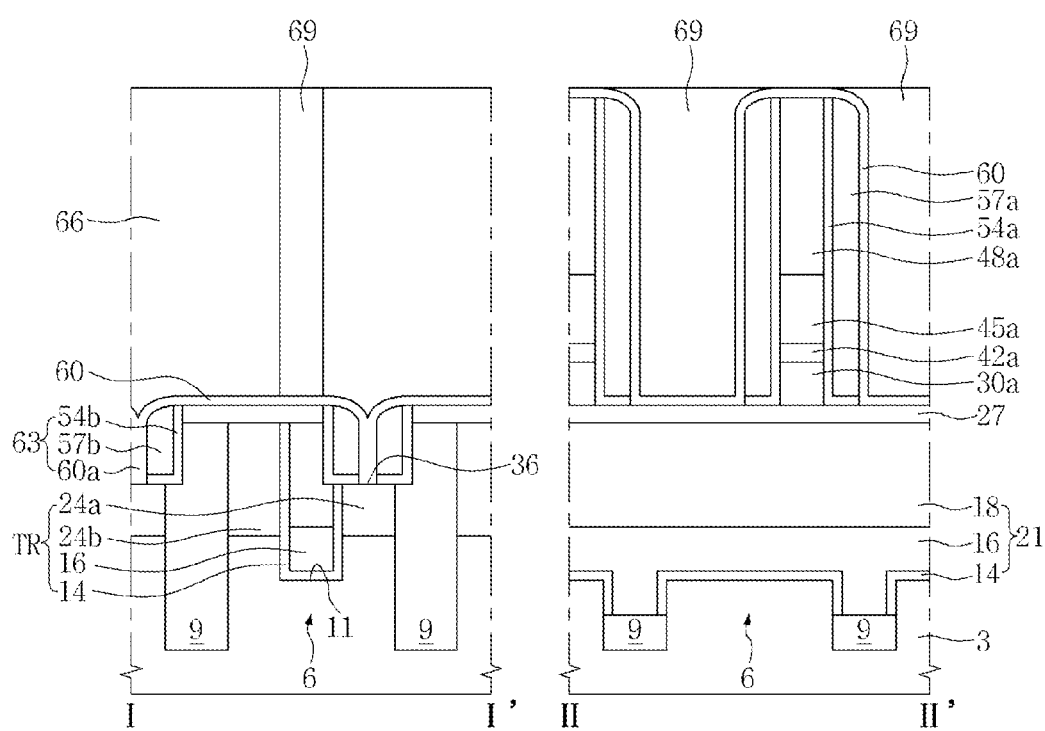
Figure 22B:
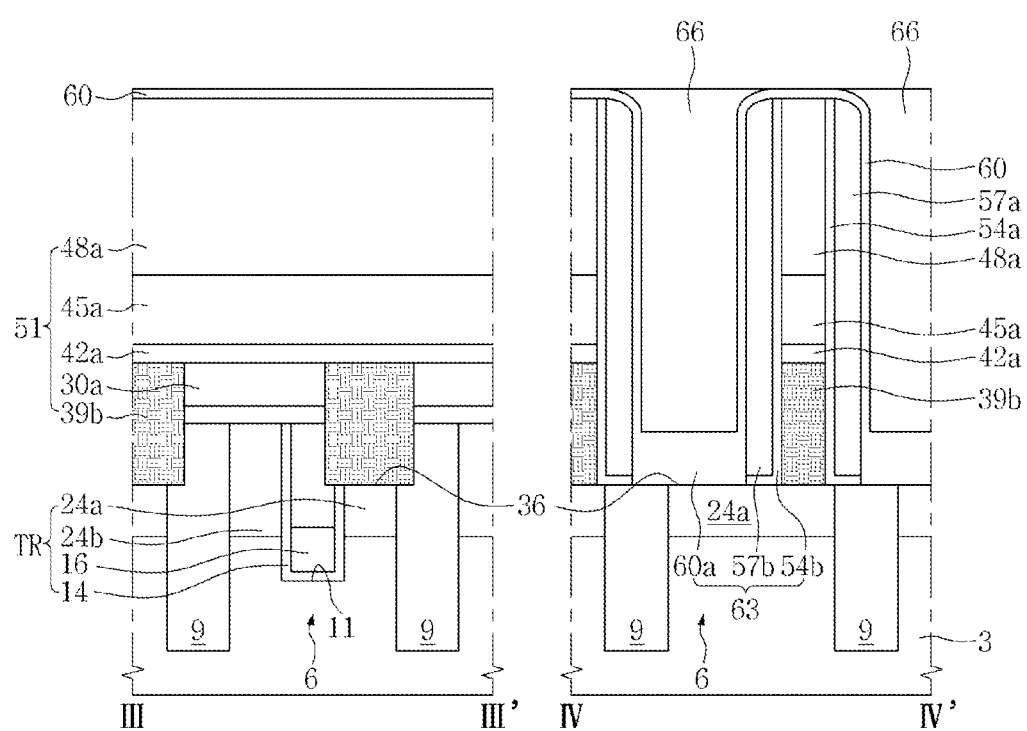

Referring to FIGS. 19, 22A, and FIG. 22B, an insulating isolation pattern 69 may be formed to fill the separation hole 66a. The insulating isolation pattern 69 may be formed of a material having an etch selectivity with respect to the molding layer 66. The insulating isolation pattern 69 may be formed of silicon nitride. The insulating isolation pattern 69 may be formed to overlap the gate structure 21.

Figure 23A:
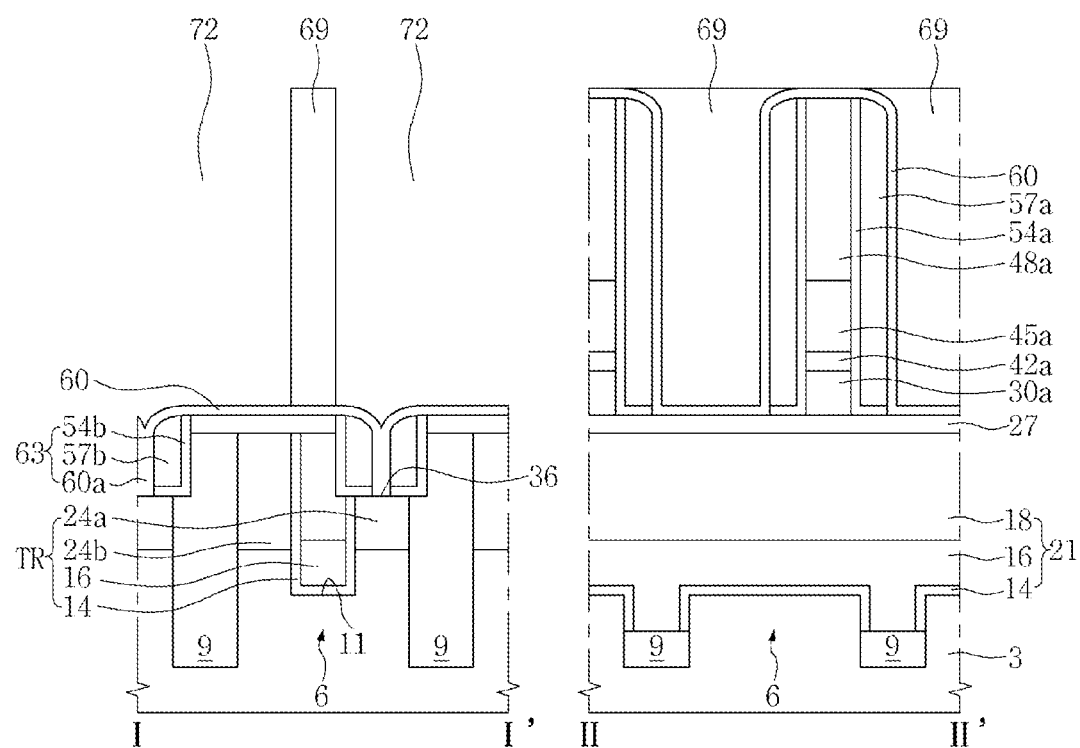
Figure 23B:
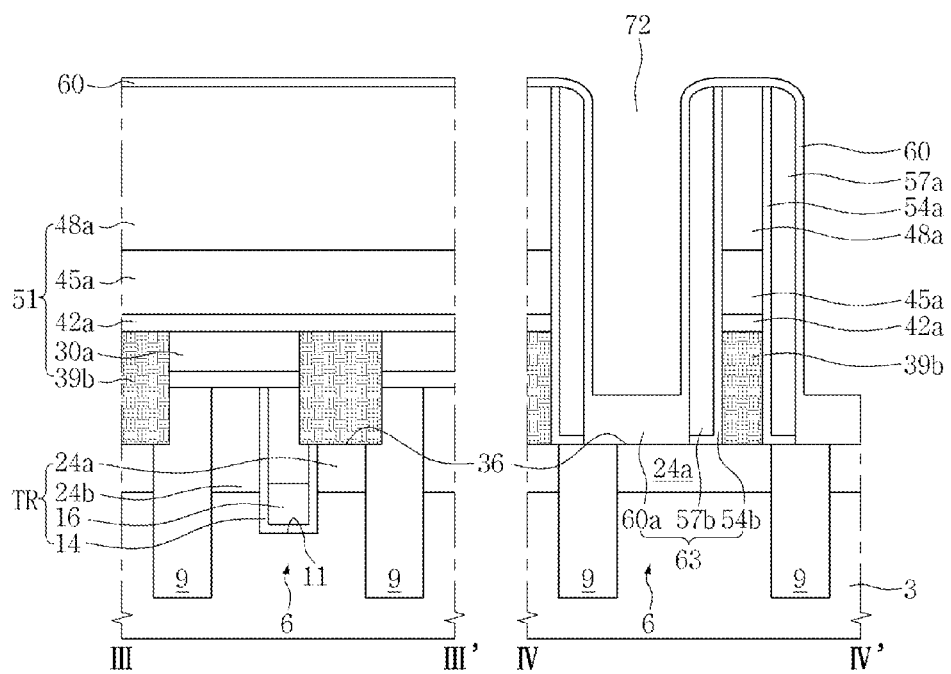

Referring to FIGS. 19, 23A, and 23B, a contact hole 72 may be formed by removing the molding layer 66. The removing of the molding layer 66 may include performing an etching process using the passivation layer 60 as an etch-stop layer.

Figure 24A:
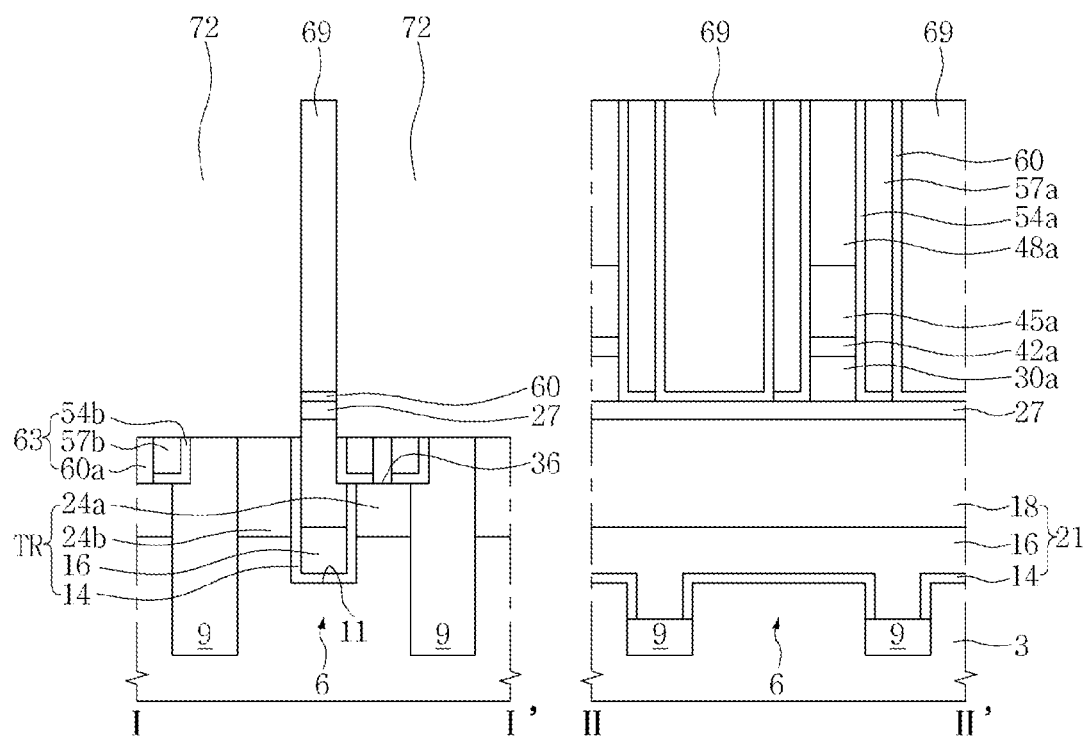
Figure 24B:
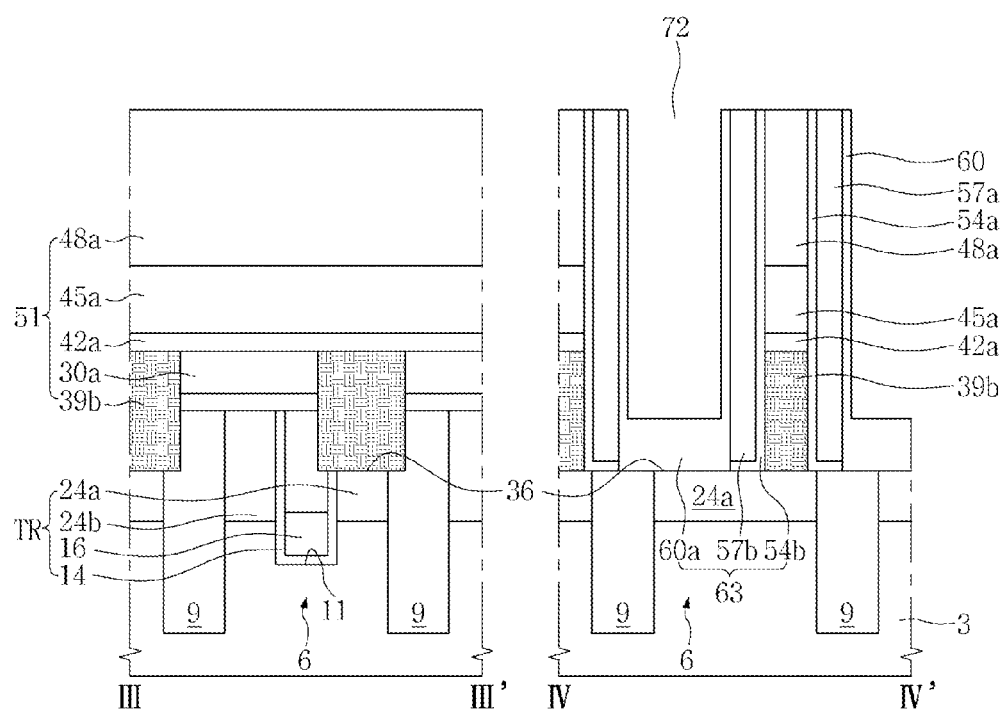

Referring to FIGS. 19, 24A, and 24B, material layers in a lower portion of the contact hole 72 may be etched until exposing the second source/drain region 24b. A part of the second source/drain region 24b may be etched. A bottom surface of the contact hole 72 may be formed at a higher level than a bottom surface of the groove 36.

Figure 25A:
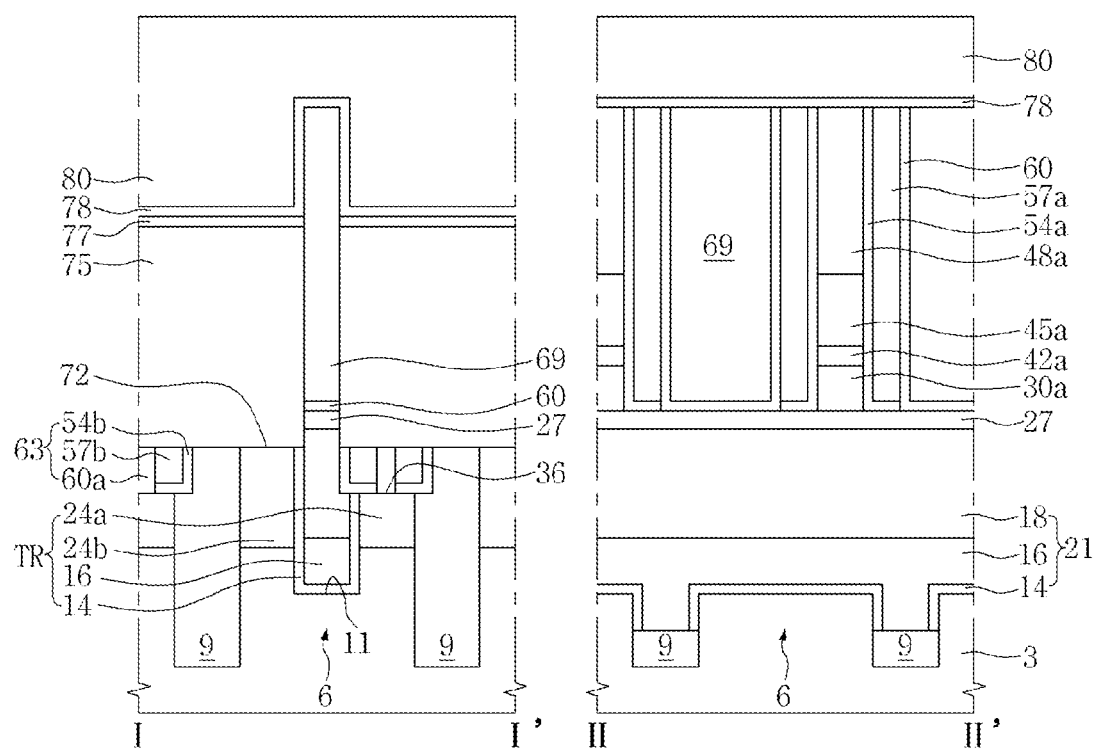
Figure 25B:
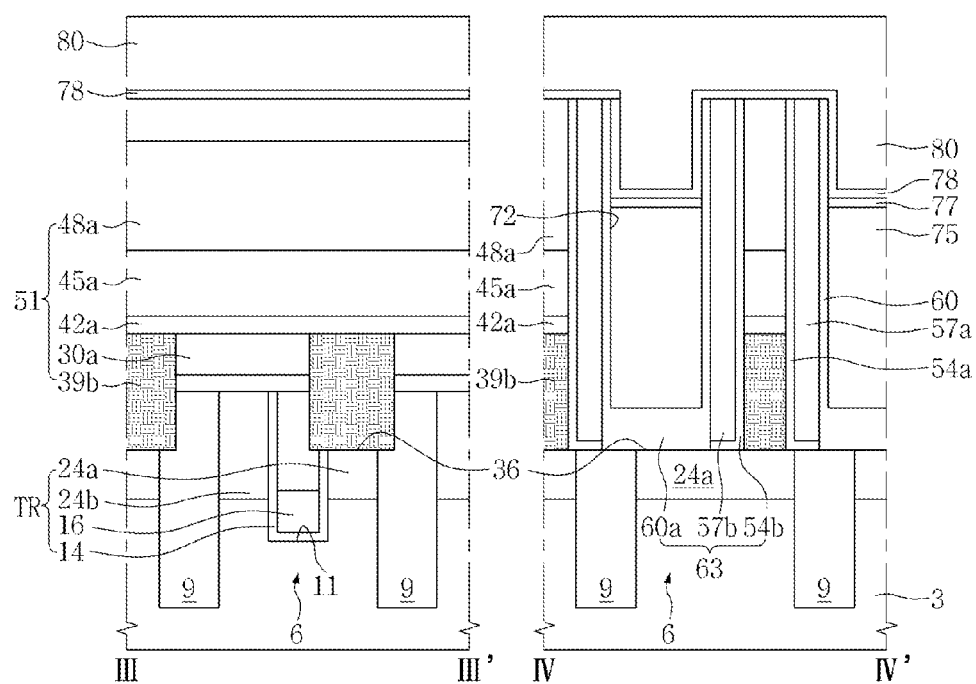

Referring to FIGS. 19, 25A, and 25B, a lower contact pattern 75 may be formed to partially fill the contact hole 72. The formation of the lower contact pattern 75 may include forming a polysilicon layer on a substrate having the contact hole 72 and partially etching the polysilicon layer.

A silicide process may be performed, and then a metal silicide layer 77 may be formed on the lower contact pattern 75. The metal silicide layer 77 may be formed of, for example, cobalt silicide, titanium silicide, or tungsten silicide.

A barrier layer 78 and an upper contact layer 80 may be sequentially formed on a substrate having the metal silicide layer 77. The barrier layer 78 may be formed of a metal nitride, and the upper contact layer 80 may be formed of a metal such as tungsten.

Figure 26A:
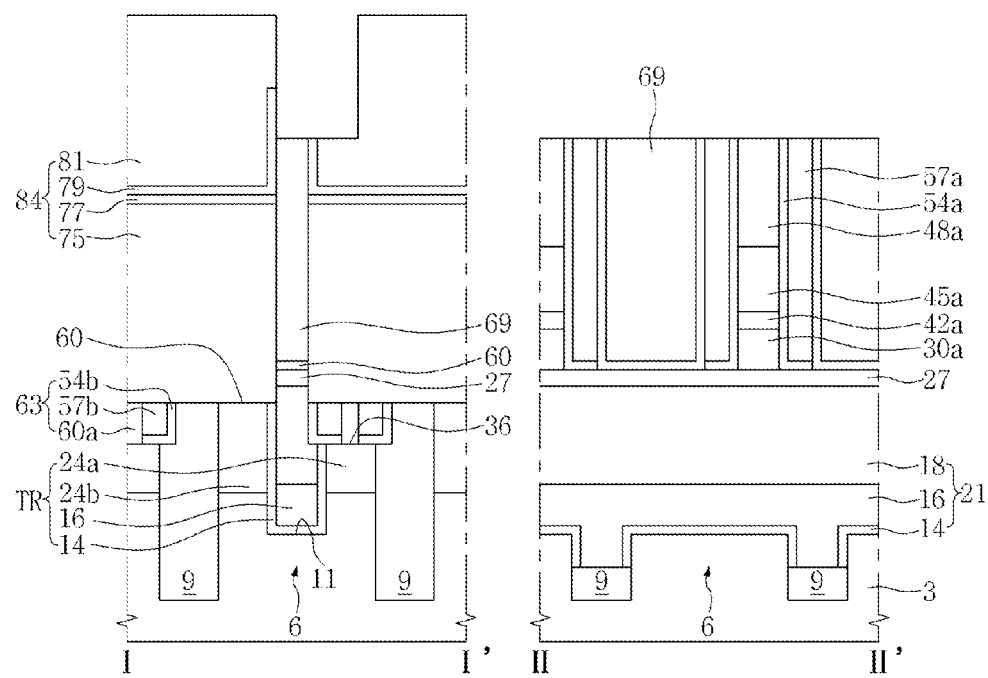
Figure 26B:
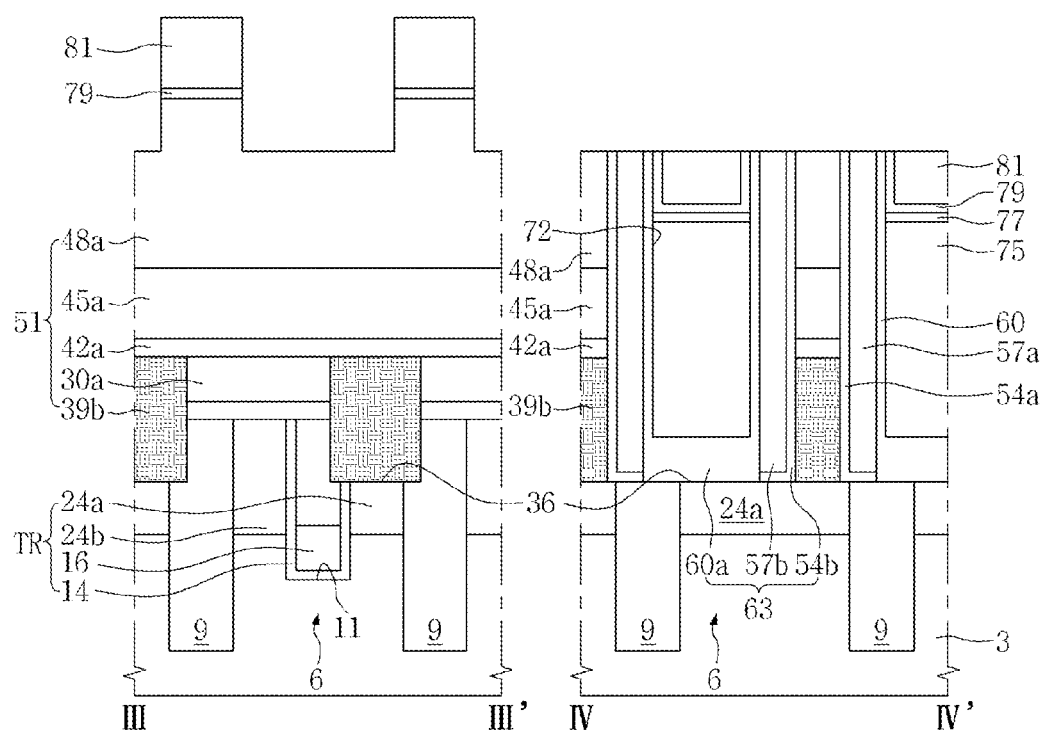

Referring to FIGS. 19, 26A, and 26B, an upper contact pattern 81 and a barrier pattern 79 may be formed by patterning the upper contact layer 80 and the barrier layer 78 under the upper contact layer 80. The lower contact pattern 75, the metal silicide layer 77, the barrier pattern 79, and the upper contact pattern 81 may form a contact structure 84. The second spacer 57a may be exposed by patterning the upper contact layer 80 and the barrier layer 78.

Figure 27A:
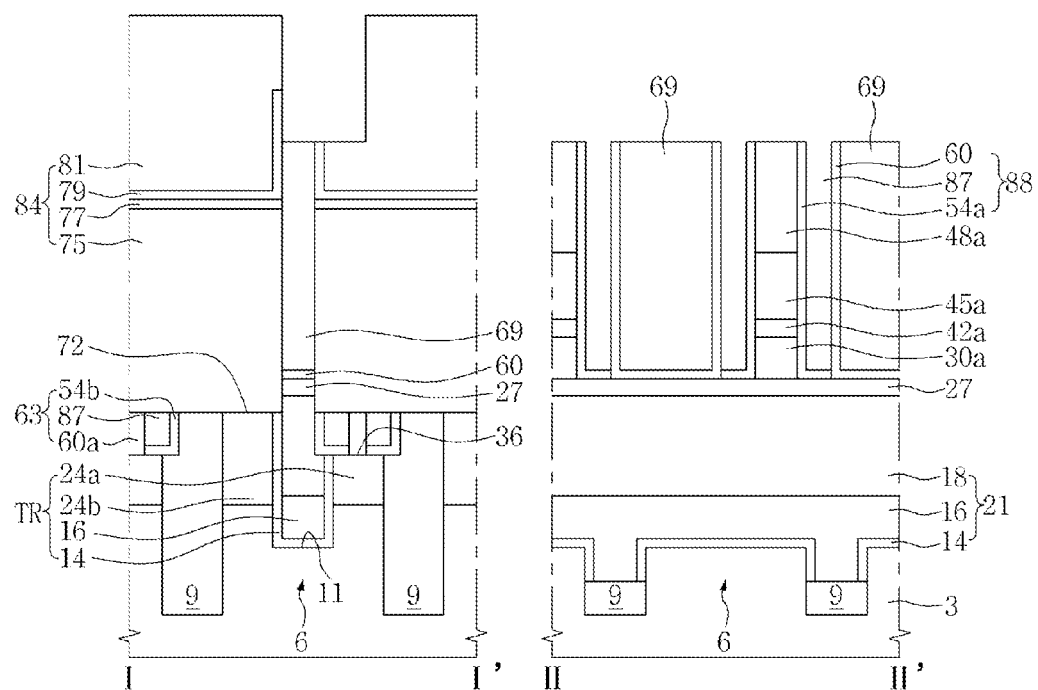
Figure 27B:
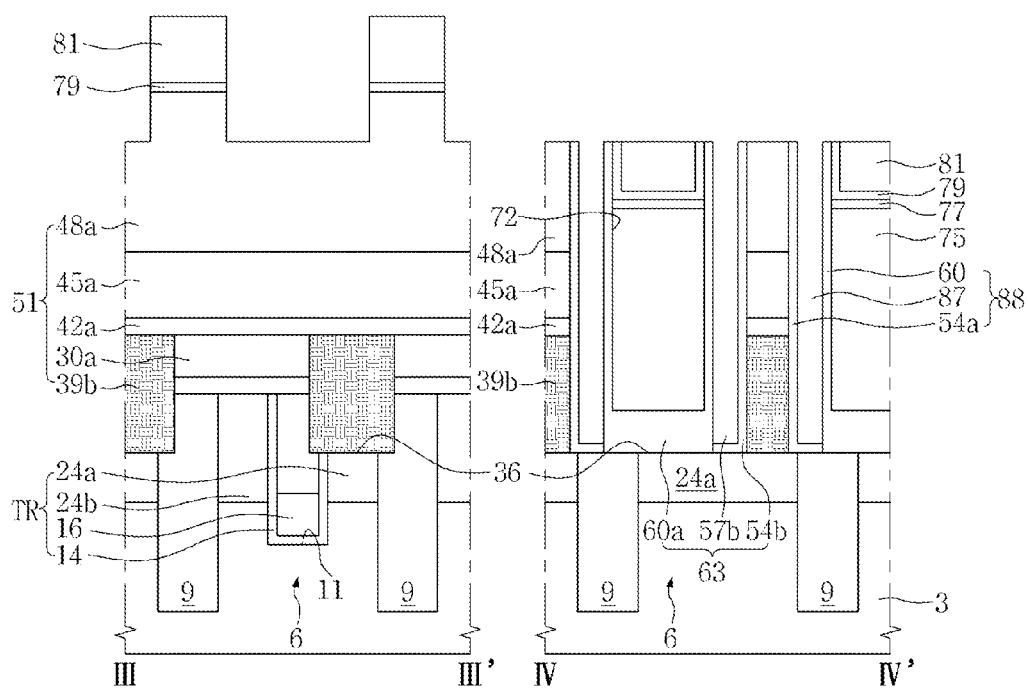

Referring to FIGS. 19, 27A, and 27B, after removing the exposed second spacer 57a, an air spacer 87 may be formed when removing the second spacer 57a. Therefore, a spacer structure 88 including the inner spacer 54a, the air spacer 87, and the outer spacer 60 may be formed on a side surface of the interconnection structure 51.

Referring to FIGS. 1, 4A, and 4B again, an upper capping pattern 90 configured to surround side surfaces of the contact structure 84 located at a higher level than the interconnection structure 51 may be formed by sealing an upper portion of the air spacer 87.

A method of forming a semiconductor device described in FIGS. 6, 7A, and 7B will be described with reference to FIGS. 28A, 28B, 29A, and 29B.

Referring to FIGS. 6, 28A, and 28B, the active region 6, the isolation region 9, the TR, the groove 36, the interconnection structure 51, the first and second spacers 54a and 57a, and the passivation layer 60 may be formed on a semiconductor substrate 3 by proceeding with the same process in the method as described in FIG. 8 to FIG. 20B. A molding layer 166 which is the same as the molding layer 66 in FIGS. 20A and 20B may be formed on the above-described substrate.

A separation hole 166a may be formed by patterning the molding layer 166. The separation hole 166a may overlap the first source/drain region 24a and the gate structure 21.

Referring to FIGS. 6, 29A, and 29B, an insulating isolation pattern 169 may be formed to fill the separation hole 166a. The insulating isolation pattern 169 may overlap the first source/drain region 24a and the gate structure 21. The insulating isolation pattern 169 may be formed of silicon nitride.

A contact hole 172 may be formed to expose the second source/drain region 24b. The formation of the contact hole 172 may include exposing the second source/drain region 24b, and removing the molding layer 166 and a material layer under the molding layer 166. An upper portion of the second source/drain region 24b may be recessed when forming the contact hole 172.

Referring to FIGS. 6, 7A, and 7B again, a contact structure 184 may be formed by performing substantially the same process for forming the contact structure 84 as described in FIGS. 25A, 25B, 26A, and 26B, and the same process for forming the air spacer 87 may be performed as described in FIGS. 27A and 27B. Subsequently, an upper capping pattern 90 configured to surround an upper side surface of the contact structure 184 may be formed by sealing an upper portion of the air spacer 87.

Figure 30:
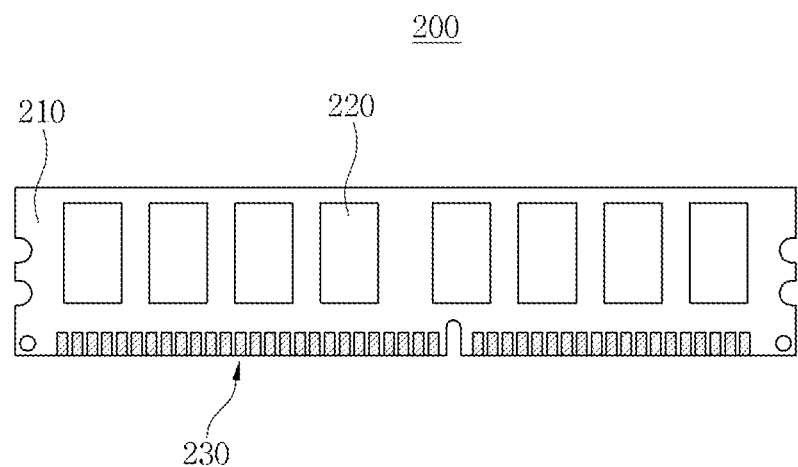
FIGS. 30 and 31 are views conceptually illustrating semiconductor modules including the semiconductor device in accordance with at least one example embodiment of the inventive concepts.

FIG. 30 is a view conceptually illustrating a semiconductor module 200 including a semiconductor device in accordance with at least one example embodiment of the inventive concepts.

Referring to FIG. 30, the semiconductor module 200 may be a memory module including a memory device. The semiconductor module 200 may include a module substrate 210, a plurality of semiconductor devices 220 disposed on the module substrate 210, and a plurality of terminals 230 arranged on one side of the module substrate 210. The terminals 230 may include a conductive metal. The terminals 230 may be electrically connected to the semiconductor devices 220.

The module substrate 210 may be a memory module substrate. The module substrate 210 may include a PCB.

The semiconductor devices 220 may be memory devices. The semiconductor devices 220 may be DRAM devices. The semiconductor devices 220 may be the semiconductor device in accordance with at least one example embodiment of the inventive concepts or a semiconductor package including the semiconductor device.

Figure 31:
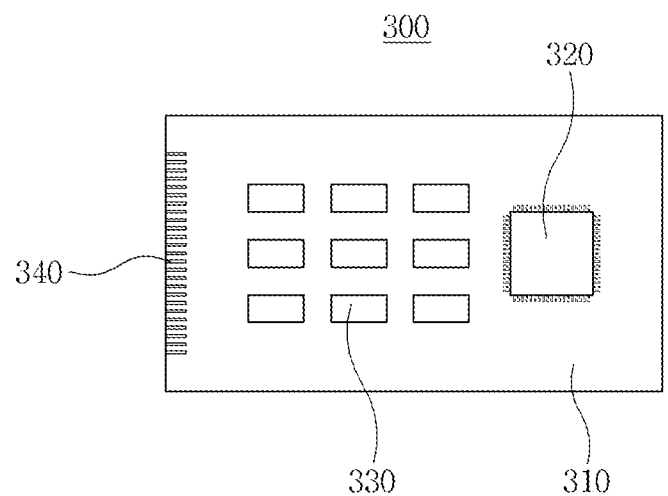

FIG. 31 is a view conceptually illustrating a semiconductor module 300 including the semiconductor device in accordance with at least one example embodiment of the inventive concepts.

Referring to FIG. 31, the semiconductor module 300 may include a processor 320, a semiconductor device 330 mounted on a module substrate 310, and I/O terminals 340. The processor 320 or the semiconductor device 330 may be the semiconductor device in accordance with at least one example embodiment of the inventive concepts or a semiconductor package including the semiconductor device. The I/O terminals 340 may be disposed on at least one side of the module substrate 310.

Figure 32:
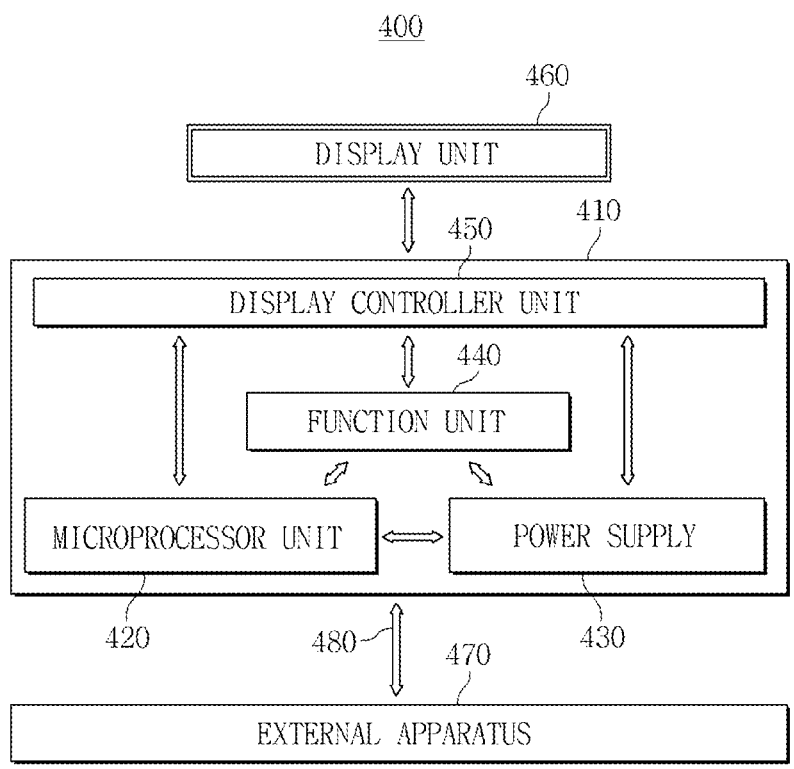
FIGS. 32 and 33 are block diagrams conceptually illustrating electronic systems including the semiconductor device in accordance with at least one example embodiment of the inventive concepts.

FIG. 32 is a block diagram illustrating an electronic system 400 including the semiconductor device in accordance with at least one example embodiment of the inventive concepts.

Referring to FIG. 32, the electronic system 400 may include a body 410, a display unit 460, and an external apparatus 470. The body 410 may include a microprocessor unit 420, a power supply 430, a function unit 440, and/or a display control unit 450. The body 410 may include a system board or a motherboard having a PCB or the like, and/or a case.

The microprocessor unit 420, the power supply 430, the function unit 440, and the display control unit 450 may be mounted or disposed on an upper surface of the body 410 or inside of the body 410. The display unit 460 may be disposed on the upper surface of the body 410 or inside/outside the body 410. The display unit 460 may display an image processed by the display control unit 450. For example, the display unit 460 may include a liquid crystal display (LCD), active matrix organic light emitting diodes (AMOLED), or various display panels. The display unit 460 may include a touch screen. Therefore, the display unit 460 may have an input/output function.

The power supply 430 may supply a current or voltage to the microprocessor unit 420, the function unit 440, the display control unit 450, and the like. The power supply 430 may include a charging battery, a socket for a dry cell, or a voltage/current converter.

The microprocessor unit 420 may receive a voltage from the power supply 430 to control the function unit 440 and the display unit 460. For example, the microprocessor unit 420 may include a CPU or application processor (AP). The function unit 440 may perform various functions. For example, the function unit 440 may include a touch pad, a touch screen, a volatile/non-volatile memory, a memory card controller, a camera, a lighting, an audio and moving picture reproducing processor, a wireless radio antenna, a speaker, a microphone, a USB port, or units having other various functions. The microprocessor unit 420 and the function unit 440 may include the semiconductor device in accordance with at least one example embodiments of the inventive concepts.

Figure 33:
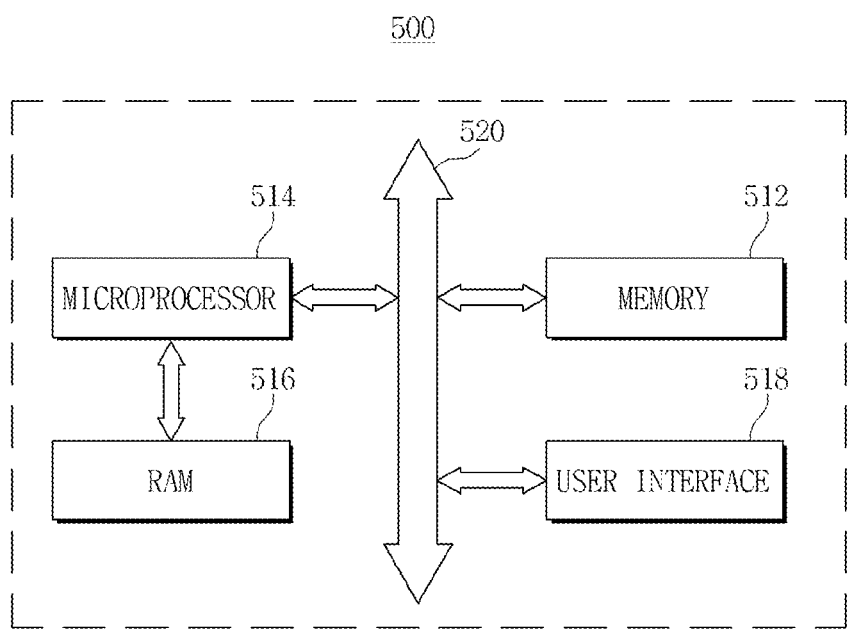

FIG. 33 is a block diagram conceptually illustrating an electronic system including the semiconductor device in accordance with at least one example embodiment of the inventive concepts.

Referring to FIG. 33, an electronic system 500 may include the semiconductor device in accordance with at least one example embodiment of the inventive concepts. The electronic system 500 may include a microprocessor 514, a memory system 512, and a user interface 518 configured to perform data communication through a bus 520. The microprocessor 514 may include a CPU or AP. The electronic system 500 may further include a RAM 516 in direct communication with the microprocessor 514. The microprocessor 514 and/or the RAM 516 may be assembled within a single package. The user interface 518 may be used to input data to the electronic system 500, or output data from the electronic system 500. For example, the user interface 518 may include a touch pad, a touch screen, a keyboard, a mouse, a voice detector, a cathode ray tube (CRT) monitor, an LCD, an AMOLED, a plasma display pad (PDP), a printer, a lighting, or various input/output devices. The memory system 512 may store operational codes of the microprocessor 514, data processed by the microprocessor 514, or data received from the outside. The memory system 512 may include a memory controller, a hard disk, or a solid state drive (SSD). The microprocessor 514, the RAM 516, and/or the memory system 512 may include the semiconductor devices in accordance with at least one example embodiments of the inventive concepts.

In accordance with at least one example embodiment of the inventive concepts, a structure of a semiconductor device and a method capable of reliably forming a contact between a contact area of an active region and a contact structure on the active region can be provided.

In accordance with at least one example embodiment of the inventive concepts, a structure of a semiconductor device and a method capable of reliably forming a contact conductive pattern of the interconnection structure for electrically connecting an interconnection structure to a contact area can be provided.

In accordance with at least one example embodiment of the inventive concepts, a structure of a semiconductor device and a forming method capable of increasing a channel width of a transistor can be provided.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
    an isolation region in a semiconductor substrate and defining an active region;
    a gate electrode in the active region;
    a gate dielectric layer between the active region and the gate electrode;
    a first source/drain region and a second source/drain region in the active region on opposite sides of the gate electrode respectively;
    an interconnection structure crossing the gate electrode, overlapping the first and second source/drain regions at opposite sides of the gate electrode, electrically connecting to the first source/drain region, and spaced apart from the second source/drain region; and
    a contact structure on the second source/drain region.

2. The semiconductor device of claim 1, wherein the first source/drain region has a first width in a first direction and has a second width smaller than the first width in a second direction perpendicular to the first direction, wherein the first direction is a length direction of the gate electrode, and the second direction is a length direction of the interconnection structure.

3. The semiconductor device of claim 1, wherein
    the isolation region includes a first isolation line and a second isolation line parallel to each other,
    the isolation region includes a third isolation line and a fourth isolation line parallel to each other, and
    the third and fourth isolation lines intersect the first and second isolation lines.

4. The semiconductor device of claim 3, wherein the interconnection structure is between the first and second isolation lines and closer to the second isolation line than the first isolation line.

5. The semiconductor device of claim 1, wherein
    the second source/drain region has a first upper surface and a second upper surface, and
    the first upper surface is at a higher level than the second upper surface.

6. The semiconductor device of claim 5, wherein the first upper surface of the second source/drain region overlaps the interconnection structure and is spaced apart from the interconnection structure, and the second upper surface of the second source/drain region overlaps the contact structure and is electrically connected to the contact structure.

7. The semiconductor device of claim 1, wherein the interconnection structure includes a contact conductive pattern electrically connected to the first source/drain region, wherein a bottom surface of the contact conductive pattern of the interconnection structure is at a lower level than the contact structure.

8. The semiconductor device of claim 1, further comprising:
    an insulating spacer structure on side surfaces of the interconnection structure.

9. The semiconductor device of claim 8, wherein the second source/drain region overlaps the contact structure, the insulating spacer structure, and the interconnection structure.

10. The semiconductor device of claim 8, wherein the insulating spacer structure includes an air spacer.

11. A semiconductor device, comprising:
    an active region having a first side surface and a second side surface facing each other, and a third side surface and a fourth side surface facing each other;
    a first source/drain region and a second source/drain region in the active region and spaced apart from each other;
    a gate electrode in the active region between the first and second source/drain regions;
    a gate dielectric layer between the active region and the gate electrode;
    an interconnection structure between the first and second side surfaces of the active region, closer to the second side surface than the first side surface, and electrically connected to the first source/drain region; and
    a contact structure electrically connected to the second source/drain region.

12. The semiconductor device of claim 11, wherein the second source/drain region overlaps the contact structure and the interconnection structure.

13. The semiconductor device of claim 11, wherein the interconnection structure crosses the gate electrode and passes over the third and fourth side surfaces of the active region.

14. The semiconductor device of claim 11, wherein lengths of the first and second side surfaces of the active region are different from lengths of the third and fourth side surfaces.

15. The semiconductor device of claim 11, wherein
    the gate electrode extends in a first direction such that a length of the gate electrode in the first direction is greater than a thickness of the gate electrode in a second direction that crosses the first direction,
    the first and second source/drain regions each include a first width in the first direction and a second width in the second direction,
    the second widths of the first and second source/drain regions are smaller than the first widths of the first and second source/drain regions, respectively.

16. A semiconductor device, comprising:
    an isolation region in a semiconductor substrate and defining an active region, wherein the isolation region includes a first isolation line and a second isolation line facing each other, and a third isolation line and a fourth isolation line facing each other;
    a gate trench crossing the active region, and the first and second isolation lines;
    a gate electrode and a gate capping pattern stacked and in the gate trench;
    a gate dielectric layer between the gate electrode and the active region;

a first source/drain region and a second source/drain region in the active region on respective sides of the gate electrode;

an interconnection structure between the first and second isolation lines, closer to the second isolation line than the first isolation line, and electrically connected to the first source/drain region; and a contact structure overlapping the second source/drain region, electrically connected to the second source/drain region, and spaced apart from the interconnection structure.

17. The semiconductor device of claim 16, wherein an upper surface of the contact structure is at a higher level than the interconnection structure.

18. The semiconductor device of claim 16, wherein the second source/drain region comprises a first upper surface and a second upper surface, the second upper surface is at a lower level than the first upper surface, the first upper surface of the second source/drain region is a portion overlapping the interconnection structure in a plan view, and the second upper surface of the second source/drain region is a portion overlapping the contact structure in the plan view.

19. The semiconductor device of 16, wherein the contact structure overlaps the second source/drain region and overlaps the isolation region adjacent to the second source/drain region.

20. The semiconductor device of claim 16, further comprising:

an insulating isolation pattern overlapping the active region and adjacent to the interconnection structure and the contact structure.

* * * * *